United States Patent [19]
Okumura

[11] Patent Number: 5,218,221
[45] Date of Patent: Jun. 8, 1993

[54] SEMICONDUCTOR DEVICE AND MANUFACTURING METHOD THEREOF

[75] Inventor: Yoshinori Okumura, Hyogo, Japan

[73] Assignee: Mitsubishi Denki Kabushiki Kaisha, Tokyo, Japan

[21] Appl. No.: 870,745

[22] Filed: Apr. 20, 1992

Related U.S. Application Data

[63] Continuation of Ser. No. 597,673, Oct. 17, 1990, abandoned.

[30] Foreign Application Priority Data

Oct. 20, 1989 [JP] Japan ................................. 1-274343
Jul. 5, 1990 [JP] Japan ................................. 2-179213

[51] Int. Cl.$^5$ ...................... H01L 29/10; H01L 29/78
[52] U.S. Cl. ................................. 257/336; 257/402; 257/408
[58] Field of Search ..................... 357/23.4, 23.12, 91, 357/23.3, 63, 90

[56] References Cited

FOREIGN PATENT DOCUMENTS 61-226968  3/1985  Japan .................................. 357/23.4

OTHER PUBLICATIONS

Kawabuchi, et al., IEEE Transactions on Electron Devices, vol. ED-32, No. 9, Sep. 1985, pp. 1685-1687.
Fuse, et al., J. Electrochem. Soc.: Solid-State Science and Technology, pp. 996-998.
Hori, et al., IEEE Electron Device Letters, vol. 9, No. 12, Dec. 1988, pp. 641-643.
Odanaka, et al., IEEE Transactions on Electron Devices, vol. ED-33, No. 3, Mar. 1986, pp. 317-321.
Hori, IEDM 89-777, pp. 777-780, Dec. 1989.
Hori, et al., IEEE Electron Device Letters, vol. 9, No. 6, Jun. 1988, pp. 300-302.
Fuse, et al., IEEE Transactions on Electron Devices, vol. ED-34, No. 2, Feb. 1987, pp. 356-359.
(K.K.) Kogyochosa-Kai, Electronics-Zenshu (8) Ion Implantation Technique.
Shibata et al., "High Performance Half-Micron PMOS-FETs With 0.1 μm Shallow P+N Junction Utilizing Selective Silicon Growth and Rapid Thermal Annealing", IEDM 1987, pp. 590-593.

Primary Examiner—Mark V. Prenty
Attorney, Agent, or Firm—Lowe, Price, LeBlanc & Becker

[57] ABSTRACT

A semiconductor device which includes a MOS type transistor has impurity ion implanted regions (4) of the same conductivity type as that of the semiconductor substrate (1) for controlling a threshold voltage of a channel region, at least in the vicinity of a channel region provided between the source/drain regions (6, 8) on the surface of the semiconductor substrate (1). In the device the concentration distribution in the impurity ion-implanted regions (4) is higher in the vicinity of opposite ends of the channel region and lower in a central portion of the channel region. By employing the structure of this semiconductor device, while holding a suitable threshold voltage, a high potential barrier is formed at both ends of the channel region, so that insulating breakdown voltage of the source/drain regions (6, 8) is increased. A semiconductor device of said structure is manufactured by implanting impurity ions at a predetermined tilt angle with a semiconductor substrate (1) rotating, using the transfer gate electrode (5) as a mask.

13 Claims, 21 Drawing Sheets

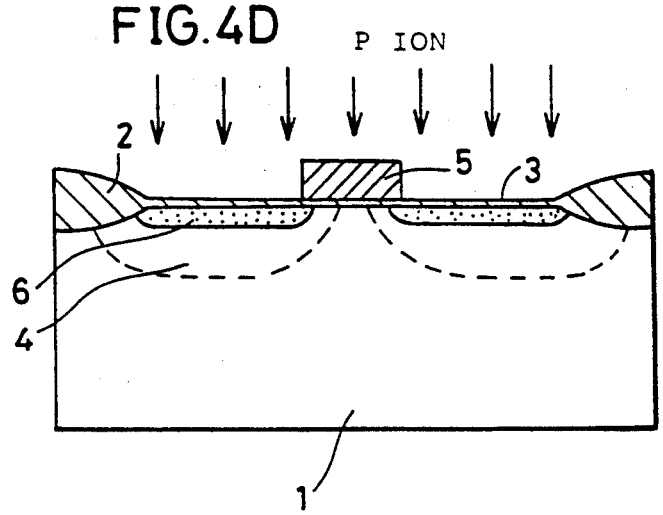
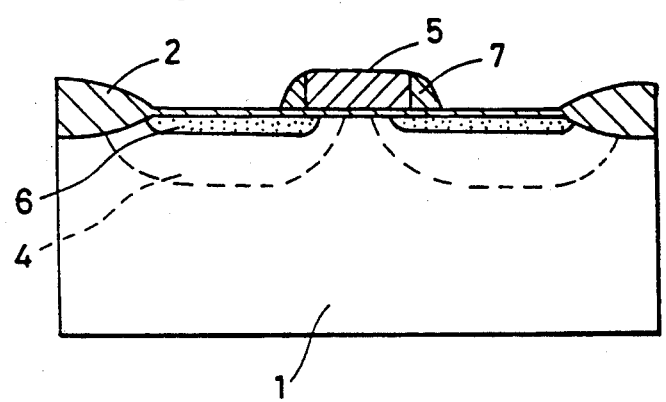
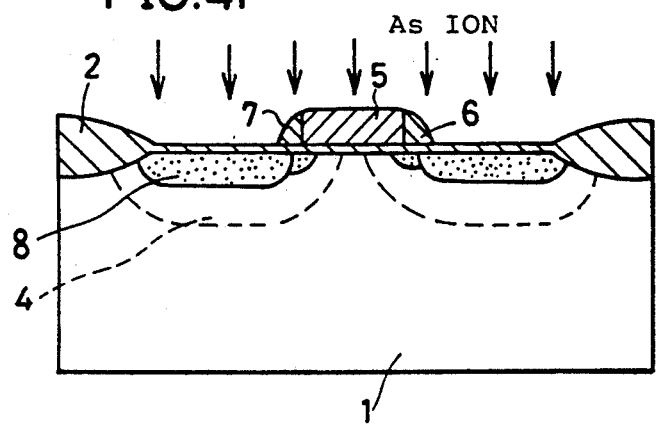

SURFACE OF SUBSTRATE

SEMICONDUCTOR DEVICE AND MANUFACTURING METHOD THEREOF

This application is a continuation of Application Ser. No. 07/597,673 filed Oct. 17, 1990 and now abandoned.

BACKGROUND OF THE INVENTION

1. Field of the Invention

The present invention relates to a semiconductor device and a manufacturing method thereof, and particularly, to structures of a MOS (Metal Oxide Semiconductor) type LDD (Lightly Doped Drain) structure transistor and other MOS type transistors and a manufacturing method thereof.

2. Description of the Background Art

The basic structure of a MOS type field effect transistor comprises a source supplying carriers and a drain drawing carriers provided on both sides of a so-called MOS capacitor which has a silicon substrate and a metal electrode disposed thereabove with a thin oxide film provided therebetween. As the metal electrode on the oxide film has a function for controlling conductance between the source and the drain, it is referred to as a transfer gate electrode. As materials for the transfer gate electrode, impurity-doped polysilicon, and metal silicide formed by applying heat treatment in inert gas to refractory metal such as tungsten deposited on polysilicon are often employed.

When the voltage of the transfer gate electrode (gate voltage) is lower than the threshold voltage $V_{th}$ required for inverting conductivity type of the area adjacent to the silicon substrate surface between a source and a drain (channel), the source/drain are isolated by a pn junction and current does not flow. When a gate voltage higher than Vth is applied, the conductivity type of the channel surface is inverted, a layer of the same conductivity type as that of the source/drain is formed in this area, and current flows between the source and the drain.

If variations in impurity concentration distribution at the boundary of the source/drain and the channel are great, the electric field strength in the area is high. Carriers get energy due to the electric field, and so-called hot carriers are produced. The carriers are then injected into the transfer gate insulating film, sometimes to form an interface state at an interface region of the transfer gate insulating film and a semiconductor substrate, or sometimes to be trapped into the transfer gate insulating film. Thus, threshold voltage and transconductance of the MOS transistor are degraded during operation. This is the MOS transistor degradation phenomenon due to hot carriers. Avalanche voltage also falls due to the hot carriers. Therefore, the electric field strength is reduced by lowering the n-type impurity concentration in the vicinity of the source/drain to attain a small variation in the concentration distribution. In a MOS type LDD structure transistor, this suppresses the MOS transistor degradation due to the hot carriers and increases avalanche voltage of the source and the drain.

One of conventional manufacturing methods of MOS type LDD structure transistors is illustrated in FIGS. 1A to 1F. First in this method, a transfer gate oxide film 3 is formed in an element forming region surrounded by an element isolation insulating film 2 on a P-type semiconductor substrate 1 by so-called LOCOS (Local Oxidation of Silicon) method (FIG. 1A). Next, for controlling the threshold voltage, p-type impurity such as boron ion is directed all over the semiconductor substrate 1 to form ion-implanted regions 4 (FIG. 1B). Subsequently, a polysilicon film is deposited all over the transfer gate oxide film 3 by the low pressure CVD (Chemical Vapor Deposition) method to form a transfer gate electrode 5 by the photolithography technique and the reactive ion etching technique (FIG. 1C). Alternatively, as the transfer gate electrode 5, a two-layer film of refractory metal such as tungsten, molybdenum and titanium or silicidized version thereof, and polysilicon can be used in place of the polysilicon. Phosphorus ions are doped into the transfer gate electrode 5 to increase its conductivity. In this case, the transfer gate electrode 5 becomes n-type, which is the same as that of the channel or the source/drain. Accordingly, even when a gate voltage is not applied to the transfer gate electrode 5, the p-type channel surface is in such a state as a positive gate voltage is effectively applied because of the difference between work functions of the n-type transfer gate electrode 5 and the p-type channel surface.

This is described as follows according to the band theory. First, with no n type transfer gate electrode 5 on the channel surface, bands of the transfer gate electrode 5, transfer gate oxide film 3 and the p type semiconductor substrate 1 appear as shown in FIG. 1G. When a transfer gate electrode 5 is formed on the channel surface with a transfer gate oxide film 3 provided therebetween, the bands change as shown in FIG. 1H. The change of bands occurs because the Fermi level $E_{FG}$ of the transfer gate electrode 5 and the Fermi level $E_{FS}$ of the semiconductor substrate 1 become equal to produce balanced conditions and the band in the vicinity of the surface of the semiconductor substrate 1 is bent downwards under the effect of the electric field by the transfer gate electrode 5. After forming the transfer gate 5, as shown in FIG. 1H, free electrons are induced in the vicinity of the surface of the semiconductor substrate 1. Accordingly, the transfer gate electrode 5 is in a condition in which positive potential is effectively applied thereto.

Also, the n-type impurity doped in the transfer gate electrode 5 may diffuse into the p-type channel surface due to thermal treatment thereafter. $V_{th}$ falls because of these reasons, and it is possible to happen that an inverted layer is already produced in the channel in some cases. The ion-implanted regions 4 described above are for overcoming the effect of impurity ion doped into the transfer gate electrode 5 by implanting p-type impurity in advance to surely obtain desired $V_{th}$.

Next, with the gate electrode 5 as a mask, n-type impurity such as phosphorus ion and arsenic ion is implanted vertically into the semiconductor substrate 1 surface to form n-type ion-implanted layers 6 (FIG. 1D). Subsequently, an insulating film of silicon dioxide or the like is deposited all over the surface of the semiconductor substrate 1 by the low pressure CVD method or the atmospheric pressure CVD method, to which anisotropic etching is applied to form sidewall spacers 7 (FIG. 1E). Next, using the transfer gate electrode 5 and the sidewall spacer 7 as masks, n-type impurity such as phosphorus ion and arsenic ion is vertically directed to the surface of the semiconductor substrate 1 to form n-type ion-implanted layers 8 of higher concentration than that of the ion-implanted layers 6 (FIG. 1F). Thus, after heat treatment for activating the implanted impurity ion, a MOS type LDD structure transistor is completed.

While a p-type semiconductor substrate is employed in the above described conventional embodiment, a substrate having a p-well, or a p-type impurity-implanted region, at least near the substrate surface can also be employed. Furthermore, as a substrate, an n-type semiconductor substrate or a substrate having n-well, an n-type impurity-implanted region, at least near the surface may be employed. In this case, a transfer gate electrode 5 is p-type, ion-implanted regions 4 for controlling a threshold voltage are n-type, and p-type ion-implanted layers 6 and 8 are formed as a source region and a drain region.

As the embodiment above is based on ion-implantation only in a direction perpendicular to the surface of the semiconductor substrate 1, the ion-implanted regions 4 for controlling the threshold voltage must be formed before forming the transfer gate electrode 5. On the other hand, as for a method of forming respective ion-implanted layers after forming a transfer gate electrode 5 by applying the oblique ion implantation method, reference is made to Japanese Patent Laying-Open No. 61-226968. As illustrated in FIGS. 2A-2D, in the method of manufacturing a MOS type semiconductor device described in the gazette, using a field oxide film 12 and a gate 14 formed on a p-type semiconductor substrate 11 as masks, n-type regions 18 are formed by implanting phosphorus ions with acceleration voltage of 20 keV (FIG. 2A). Subsequently, by directing boron ions using the gate electrode 14 as a mask at the angle of incidence of 30° and with acceleration voltage of 30 keV, p-type regions 19a are formed (FIG. 2B). Upon performing similar oblique ion implantation from the opposite side, the p-type regions 19a and 19b are formed entirely surrounding the side and the bottom of the n-type regions 18 (FIG. 2C).

Next, the photoresist 20 is formed around the gate 14, and using the same as a mask, arsenic ions are implanted at high concentration to form n-type regions 21 as the source/drain (FIG. 2D).

Finally, a silicon oxide film 22 is deposited all over the surface by the CVD method, contact holes are formed at predetermined positions in the respective regions of gate, source and drain by the reactive ion etching method or the like, and aluminum is deposited by the sputtering method or the CVD method and patterned, then an n-channel MOS type semiconductor device is completed.

As described above, according to the conventional embodiment, the p-type regions 19a and 19b are formed by oblique ion implantation, and respective ion-implanted layers are formed after forming the gate electrode 14.

Among the above-described conventional manufacturing methods of semiconductor devices, in the first conventional embodiment, by vertically implanting ions all over the surface of the semiconductor substrate 1 before forming the transfer gate electrode 5, the ion implanted regions 4, or a diffusion layer for controlling the threshold voltage, is formed. Accordingly, the p-type impurity ion concentration distribution is almost uniform all over the channel region as shown by the broken line in the graph of FIG. 3. This tendency does not change greatly after the step of thermal diffusion, and the distribution is shown by the double dashed line in FIG. 3. As the threshold voltage is determined corresponding to an almost average value of the channel potential over the channel region, upon setting a predetermined threshold voltage, the average value of the concentration distribution of the ion-implanted regions 4 to be formed is determined accordingly. In the first conventional example, the concentration distribution of the ion-implanted regions 4 in the vicinity of the channel region, or the distribution of the channel potential becomes almost uniform, and the channel potential in the vicinity of the source region and the drain region becomes a relatively low value almost the same as the potential in the center area of the channel. Accordingly, a sufficient potential barrier is not formed in the vicinity of the source/drain regions on both ends of the channel region. Thus, the extension of the depletion layer toward the semiconductor substrate in the vicinity of the source and drain increases. As the device is highly integrated, and as the length of the transfer gate electrode, or the effective channel length becomes shorter, an electrical short between the source and the drain occurs more easily because of the extension of the depletion layer, and the punchthrough breakdown voltage between the source and the drain falls. If the concentration of the ion in the channel region is increased to restrain the extension of the depletion layer, the threshold voltage becomes higher than a desired value.

Also, the so-called ALPEN (Alpha Particle Source/-Drain Penetration) effect, wherein α-particles irradiated by the radioactive isotope such as uranium or thorium in the resin molded package pass through the source/drain regions, becomes more apt to happen. Because of this ALPEN effect, if the α-ray hits a memory cell, for example, a so-called soft error in which information of a memory is broken to cause a malfunction occurs. In conditions of information "H" where electrons are not collected in capacitor of a memory cell, if the α-particles hit this memory cell, electron-hole pairs are produced because of current effect by the α-particle's energy, and the electrons are collected in a depletion layer so that the condition of information "L" is attained. When the α-particles pass through the source/drain, electron-hole pairs are produced along the path of the α-particles. The electron-hole pairs are separated by the electric field of the depletion layer between the source or the drain and the semiconductor substrate, and a new transient depletion layer is produced along the path of the α-particles. The phenomenon that a transient depletion layer is produced along the path of the α-particles is referred to as a funneling phenomenon. During operation of a transistor, if a transient depletion layer due to the funneling phenomenon is produced between the depletion layers in the vicinity of the source/drain, a transient punchthrough occurs between the source and the drain, which causes a soft error in a new mode ("L→H" soft error).

As described above, in a manufacturing method like the first conventional example, as the device is highly integrated, the source/drain breakdown voltage falls and the soft error becomes more apt to happen, and there is a problem that the initial characteristic and the long term reliability confidence of the device is degraded.

The p-type regions 19a, 19b formed in the second embodiment serve as barriers for preventing a punch through at both ends of the channel region. However, these p-type regions 19a, 19b are formed independently of control of the threshold voltage of the channel region. Accordingly, in addition to increasing the number of steps, it also affects the predetermined threshold voltage.

SUMMARY OF THE INVENTION

It is an object of this invention to provide a semiconductor device with characteristics of the source/drain breakdown voltage or the like which does not fall even when the device is highly integrated, by forming a high potential barrier only in the vicinity of the source/drain at both ends of the channel region of a MOS type transistor utilizing impurity concentration distribution of ion-implanted region for threshold voltage control and a manufacturing method thereof.

The semiconductor device according to the present invention relates to a semiconductor device including a MOS type field effect transistor having a semiconductor substrate having a region of a first conductivity type at least in the vicinity of the surface, source/drain regions of a second conductivity type formed on both of left and right sides of the channel region disposed therebetween in the vicinity of the surface from the surface of the semiconductor substrate to a predetermined depth, a transfer gate electrode formed at a position entirely covering the channel region on the surface of the semiconductor substrate with a transfer gate insulating film (3) provided therebetween, and ion-implanted regions of the first conductivity type formed at least in the vicinity of the channel region for controlling threshold voltage of the channel region. A feature of the present invention is that the ion-implanted region for threshold control has higher impurity concentration distribution in regions at both of left and right sides nearer to the source/drain than a central potion in the channel region.

According to this semiconductor device, the channel potential distribution in the channel region is low in the vicinity of center portion of the channel region corresponding to the impurity ion concentration distribution, and considerably high at both ends. Accordingly, a high potential barrier is formed at both ends of the channel region, so that the extension of the depletion layer between the source/drain regions is limited. As a result, a short of the depletion layer between the source and drain regions does not occur easily, and the breakdown voltage between the source and the drain rises.

Also, even if the α-particles penetrate into the source/drain regions, the funnelling phenomenon due to the same is constrained by the high potential barrier at the both ends of the channel region, and the transient punchthrough between the source and the drain due to the ALPEN effect is also avoided.

This invention is especially effectively applied to a MOS type LDD structure comprising source/drain regions including impurity diffusion regions of low concentration of the second conductivity type formed in the vicinity of portions right under the both sides of the transfer gate electrode and an impurity diffusion regions of higher concentration formed outside the impurity diffusion regions of low concentration.

The manufacturing method of a semiconductor device in accordance with this invention is characterized in that, in a method of manufacturing a semiconductor device including a MOS type field effect transistor of the above-described structure, the step of forming ion-implanted regions for threshold voltage control is performed using at least the transfer gate electrode as a mask, with the semiconductor substrate rotating in a plane parallel to the surface, and wherein impurity ions of the first conductivity type are implanted in an oblique direction of a given tilt angle to the surface and a thermal treatment is applied thereafter.

The manufacturing method of a semiconductor device in accordance with this invention comprises, when it is employed in manufacturing MOS type LDD structure transistors, in addition to the above steps, a step of forming sidewall spacers on both of the sidewalls of the transfer gate electrode. The source/drain regions are formed by a step of implanting impurity ions of the second conductivity type using the transfer gate electrode as a mask to form impurity ion implanted layers of low concentration, and a step of implanting impurity ions of the second conductivity type using the transfer gate electrode and the sidewall spacers as masks after the sidewall spacers are formed to form impurity ion implanted layers of high concentration. Furthermore, impurity ion implantation of the first conductivity type for setting the threshold voltage of the channel is performed between the step of forming an impurity ion implanted layers of low concentration and the step of forming the sidewall spacers, or between the step of forming the impurity ion implanted layers of high concentration and the step of the thermal treatment.

According to the manufacturing method of a semiconductor device, semiconductor devices having the above described effects can be efficiently manufactured.

Also, in another aspect, the method of manufacturing a semiconductor device according to the present invention is characterized in that the step for forming ion-implanted regions for threshold voltage control is performed by sequentially implanting impurity of the first conductivity type in two directions having a given tilt angle symmetrical to a plane vertical to the surface of the semiconductor substrate. Work effect similar to that in case of forming ion-implanted regions for threshold voltage control by the oblique rotation ion implantation also can be obtained by this manufacturing method. However, in this oblique fixed ion-implantation, as the impurity concentration distribution before diffusion step by a thermal treatment sharply changes, diffusion advances rapidly when a thermal treatment necessary for the device is applied thereafter, so that the effect of forming a potential barrier at both ends of the channel region is decreased as compared to the case of the oblique rotation ion implantation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4F are sectional views sequentially and schematically showing the manufacturing steps of the first embodiment of this invention.

DESCRIPTION OF THE PREFERRED EMBODIMENTS

One embodiment of this invention will be described below on the basis of FIGS. 4A–4F and 5.

Figure 1A:
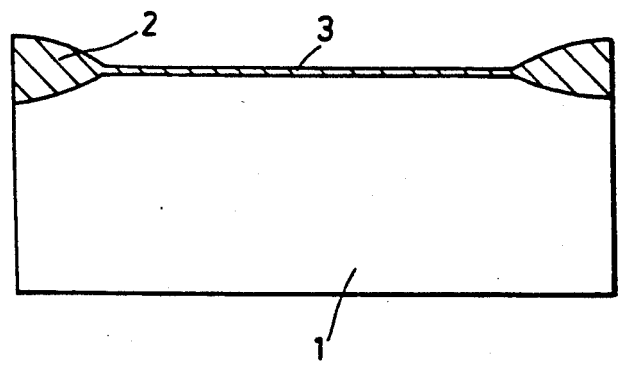
FIGS. 1A-1F are sectional views sequentially and schematically showing the manufacturing process in the first conventional example.
Figure 1B:
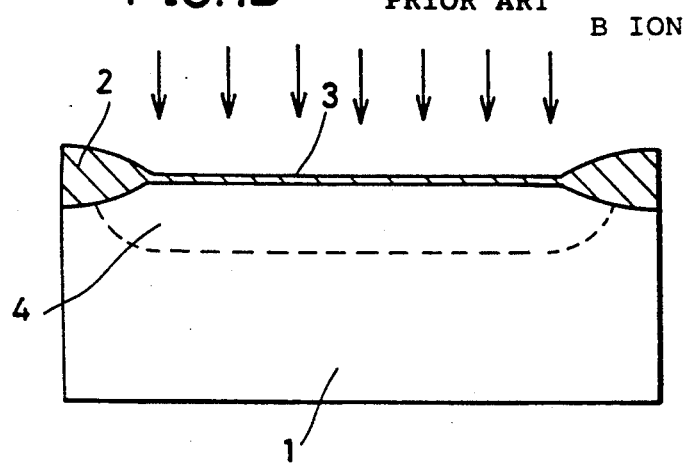
Figure 1C:
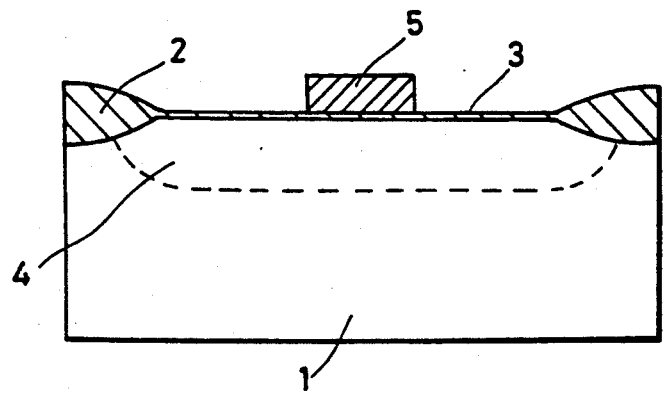
Figure 1D:
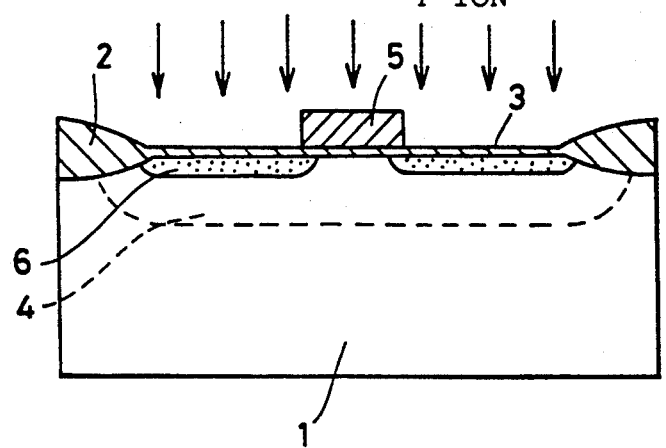
Figure 1E:
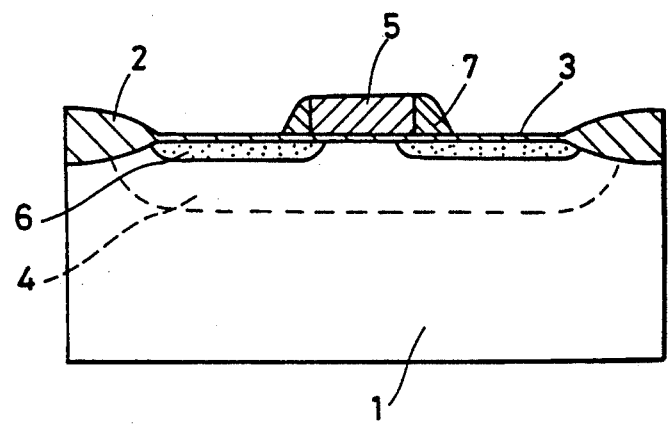
Figure 1F:
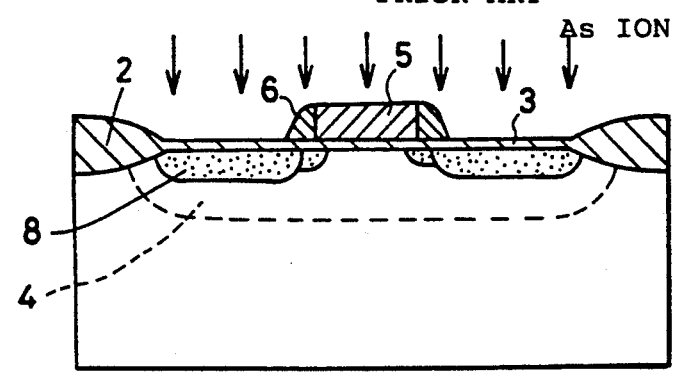
Figure 1G:
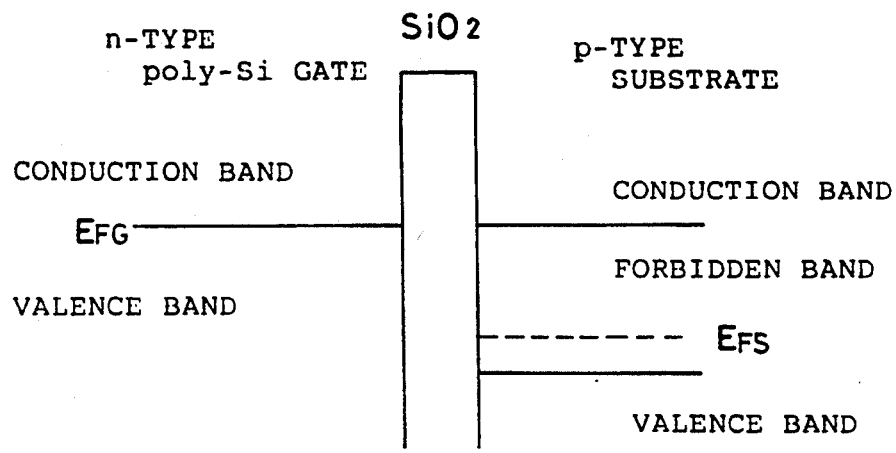
FIGS. 1G and 1H are diagrams showing conditions of change of the energy band, before and after forming a transfer gate electrode 5 on the semiconductor substrate surface, respectively.
Figure 1H:
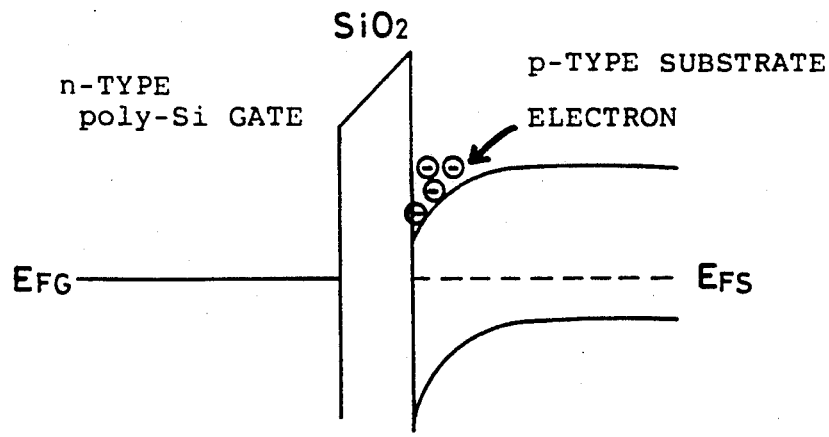
Figure 2A:
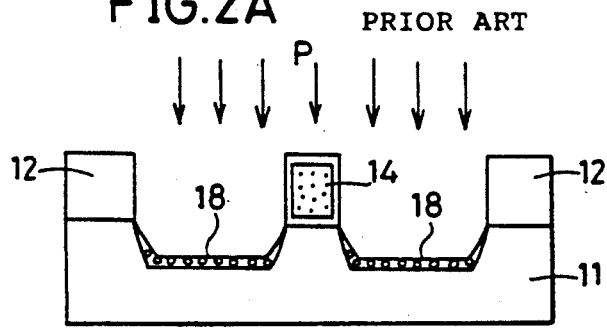
FIGS. 2A-2D are sectional views sequentially and schematically showing an outline of the manufacturing process of the second conventional example.
Figure 2B:
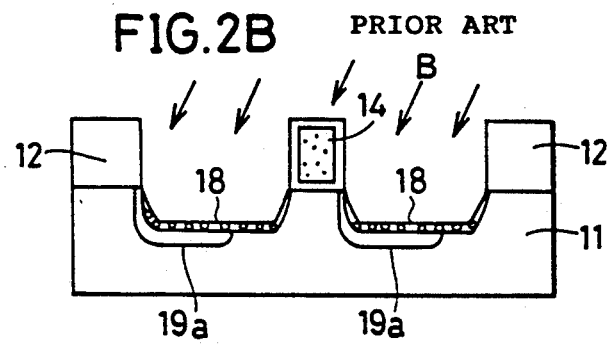
Figure 2C:
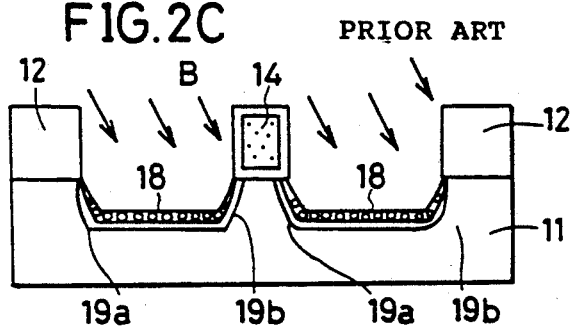
Figure 2D:
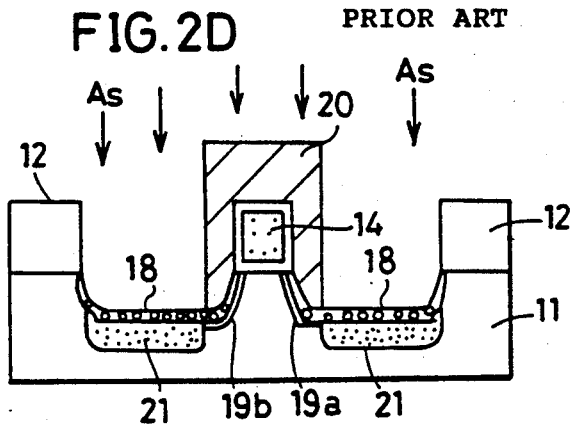
Figure 3:
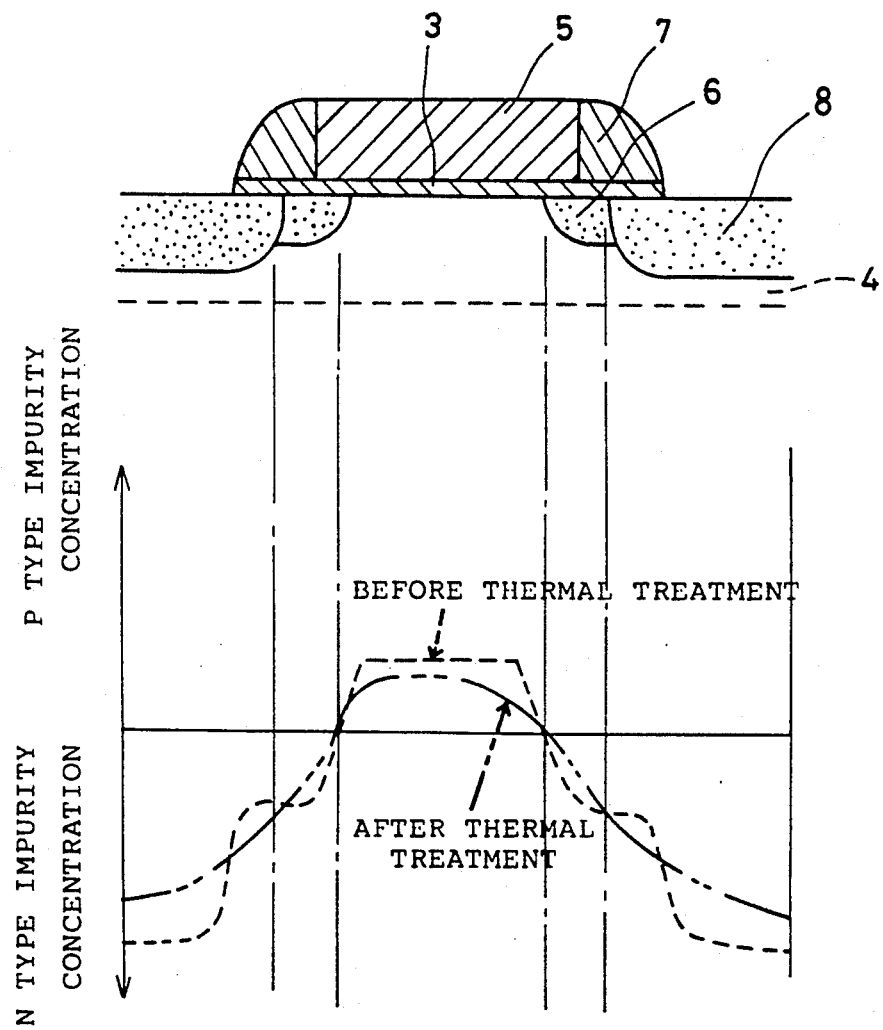
FIG. 3 is a diagram schematically showing a profile of ion-implanted layers in the vicinity of the channel of the MOS type LDD structure transistor formed according to the first conventional example, and impurity ion concentration corresponding to the same.
Figure 4A:
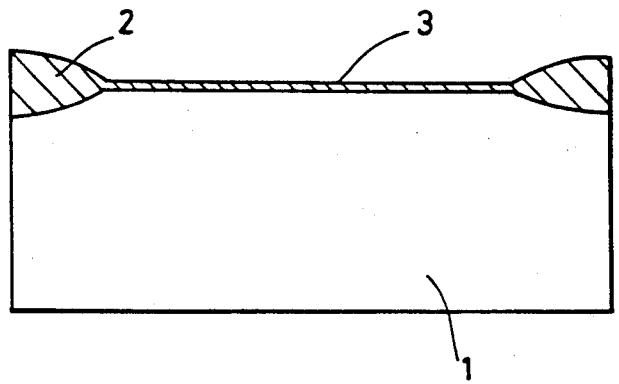
Figure 4B:
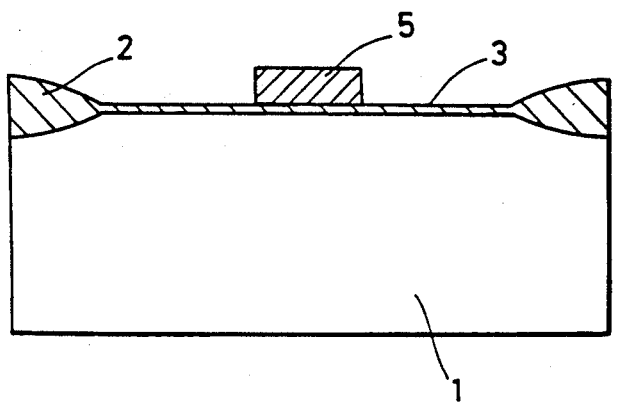

The manufacturing process of the first embodiment of this invention is shown in FIGS. 4A–4F. First, a transfer gate insulating film 3 is formed in an element forming region surrounded by an element isolation region 2 by the LOCOS method on a p-type semiconductor substrate 1 (FIG. 4A). Next, a polysilicon film is deposited all over the surface of the transfer gate insulating film 3 by the low pressure CVD method to form a transfer gate electrode 5 by the photolithography and the reactive ion etching (FIG. 4B). This transfer gate electrode 5, other than being formed of a single polysilicon layer, can be formed by depositing a doubled layer of refractory metal such as tungsten, molybdenum or titanium and polysilicon by the low pressure CVD method or the sputter method and applying the photolithography and the reactive ion etching. It may also be formed by depositing silicidized refractory metal, i.e., refractory metal silicide and applying the photolithography and the reactive ion etching.

Impurity ions such as phosphorus ions are doped into the transfer gate electrode 5 to enhance its conductivity and the conductivity type becomes the opposite from that of the semiconductor substrate, or the same as that of the channel. Accordingly, because of the positive difference of work function between the n-type transfer gate electrode and the p-type channel region, and the phosphorus ion diffusion into the channel due to the subsequent thermal treatment, the threshold voltage decreases. Thus, it is required to increase the threshold voltage by forming ion-implanted regions 4 described below.

Figure 4C:
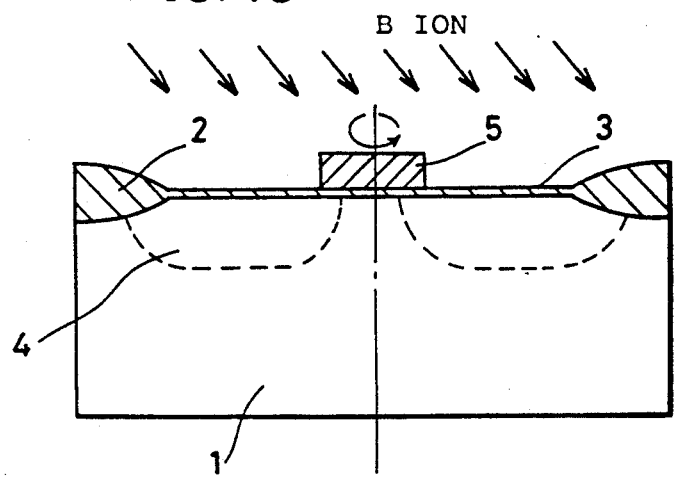

Next, boron ions which are impurity ions of p-type as is the same as that of the semiconductor substrate 1 are implanted in a oblique direction at a predetermined tilt and $\theta$ to its normal direction, all over the surface of the semiconductor substrate 1. The ion implantation in this case is performed in the range of accelerating voltage of 80 KeV–180 KeV, and dose of boron of $4 \times 10^{12}/cm^2 - 8 \times 10^2/cm^2$. At the same time, the semiconductor substrate 1 is rotated around an arbitrary normal line of the main surface of the semiconductor substrate. By this oblique rotation ion implantation, using the transfer gate electrode 5 as a mask, p-type ion-implanted layers 4 for controlling the threshold voltage are formed (FIG. 4C).

If the tilt angle $\theta$ of the ion implantation is smaller than about 10°, so-called channelling effect that the ion penetrates unusually deeply in the direction of the crystal axis, so that it is not preferred. Even if the $\theta$ is bigger than about 10°, if it is smaller than about 15°, the ion implantation into a portion right under the transfer gate electrode 5 is not performed sufficiently, so that controlling of the threshold voltage is difficult. If the $\theta$ exceeds about 60°, there is a problem that the amount of ion implantation into portion right under the transfer gate electrode 5 increases so that the threshold voltage becomes too high. Therefore the tilt angle $\theta$ of the ion implantation is preferably to be larger than 15° and smaller than 60°, and it is preferably larger than about 30° and smaller than about 45°.

After that, phosphorus ions or arsenic ions, the impurity ions of n-type which is the opposite conductivity type to that of the semiconductor substrate 1, are implanted in the normal direction all over the surface of the semiconductor substrate 1. Thus, n-type ion-implanted layers 6 are formed using the transfer gate electrode 5 as a mask (FIG. 4D). Next, an oxide film of silicon dioxide is deposited by the CVD method or the like all over the surface of the semiconductor substrate 1, which is applied with the anisotropic etching to form sidewall spacers 7.

Next, the n-type impurity ions, phosphorus ion or arsenic ion, are implanted in the normal direction, all over the surface of the semiconductor substrate 1 (FIG. 4F). Thus, n-type ion-implanted layers 8 are formed using the transfer gate electrode 5 and the sidewall spacers 7 as masks.

At this time, for forming the LDD structure, the amount of the ion implantation into the ion-implanted layers 6 is set to implement the concentration much lower than that of the ion implanted layers 8.

Also, by performing the thermal treatment, the respective ion-implanted layers 6 and 8 are activated, to form impurity ion diffusion layers.

In this embodiment, a p-type semiconductor substrate 1 is employed as a substrate for forming a MOS type LDD structure transistor, one which is provided with a p-well. However, a p-type region, at least to a predetermined depth from the substrate surface, may be employed instead.

The conductivity type of the substrate is not limited to be p-type, and the ion-implanted layers 6 and 8 can be formed as p-type with n-type substrate and ion-implanted regions 4.

The impurity ion concentration distribution of the MOS type LDD structure transistor manufactured as described above is shown in FIG. 5.

Figure 5:
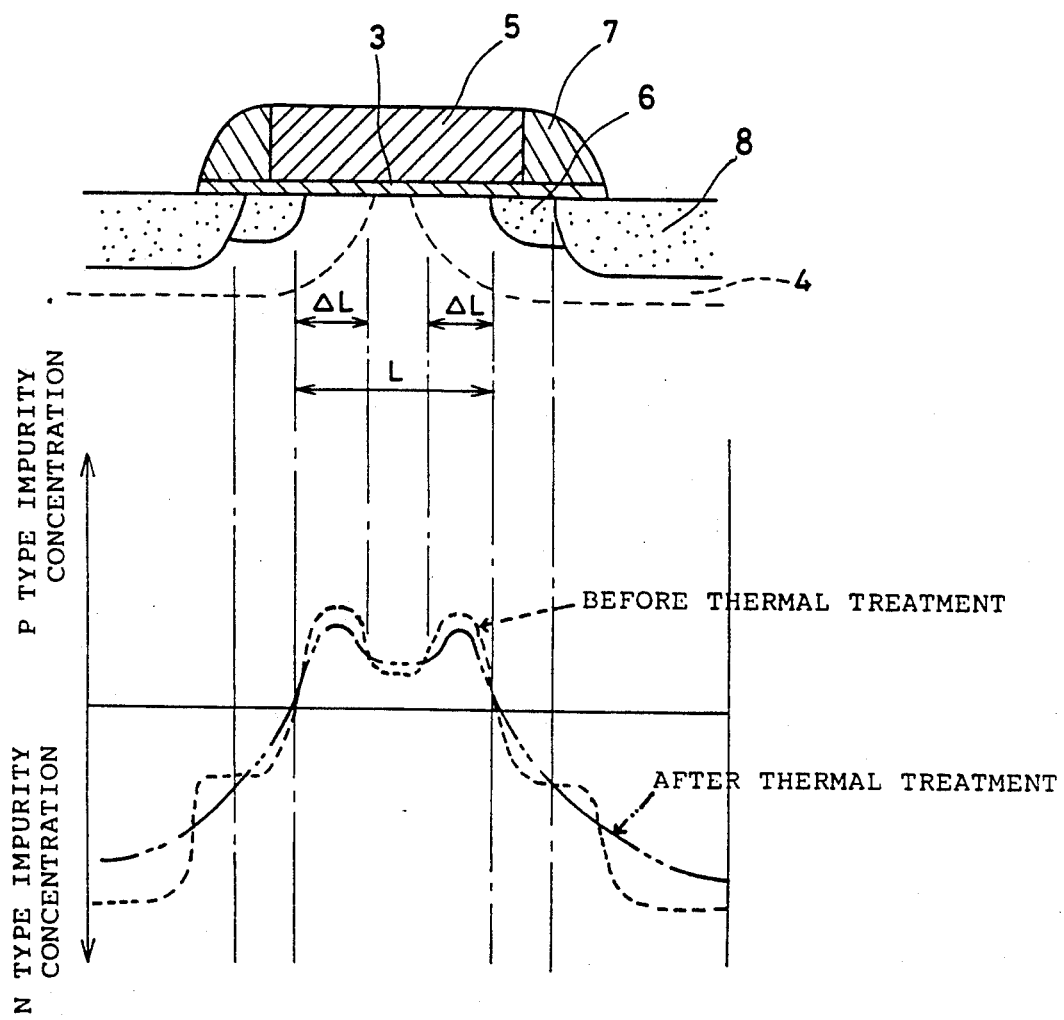
FIG. 5 is a diagram schematically showing profile of the ion-implanted layers in the vicinity of the channel of the MOS type LDD structure transistor formed in accordance with the process of this embodiment, and the corresponding impurity ion concentration distribution.

The profile and the channel potential distribution of the ion-implanted regions 4 in the case of employing the oblique rotation implantation method can be calculated, by the numerical analysis in which in addition to the LSS theory described latter, a theory of the vertical ion implantation to an amorphous target, weight function is introduced in consideration with the shadowing effect and the gate penetrating effect of the transfer gate electrode 5. The impurity ion concentration distribution in FIG. 5 schematically shows the distribution on the channel region surface based on the calculated result.

A summary of the theory of the numerical analysis for yielding the impurity ion concentration distribution of FIG. 5 will be described below.

The distribution of impurity implanted into the semiconductor substrate 1 is controlled by dose, acceleration voltage and implantation direction in the first place. The relation can be known by analyzing the mechanism of an impact of the implanted ion and the target atom. The thermal treatment conduction after the implantation can be pointed out as the second factor for determining the impurity distribution. That is to say, the distribution determined by the impact with target atoms can be changed by the diffusion during the thermal treatment.

First, the first factor not including the thermal treatment will be described. Even if the target substance is crystalline, in case of the ion implantation in random directions not to cause the channeling effect, it can be considered amorphous. Therefore, the ion implantation theory in amorphous substance is applied.

Figure 7:
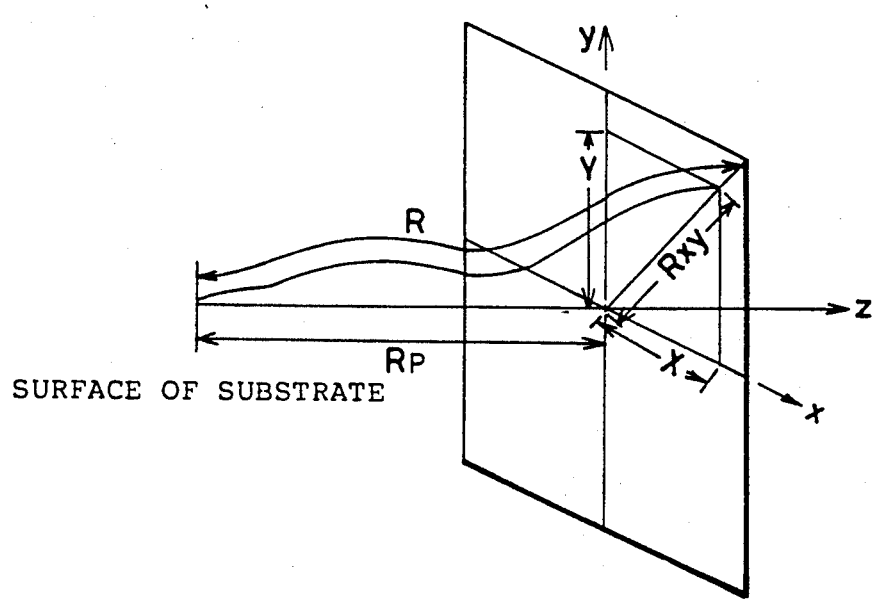
FIG. 7 is a diagram showing the ion range and system of coordinates to describe the theory of the numerical analysis for finding impurity ion concentration in the respective embodiments of this invention.

The implanted ions penetrate into the substrate from the substrate surface, and then its moving direction is bent to from the locus as shown in FIG. 7 in the substrate. The entire length R of the locus of ions in the substrate is referred to as a total range. The total range R does not always coincide with the penetration depth $R_p$ of the ions from the substrate surface. This penetration depth $R_p$ is indicated by the distance projected to an axis perpendicular to the substrate surface or projection range $R_p$ as shown in FIG. 7.

The range of the implanted ion in the x-y plane direction is component $R_{xy}$. These respective ranges, as the impact happens at random, are present around the average value with a certain distribution. Lindhard et al introduced an integral equation giving the distribution of these ranges, showing an expression of the implanted ion distribution providing considerably good coincidence with experimentally value. It is refered to as the LSS theory (for example, refer to "(K.K.) Kogyochosakai, Electronics-Zenshu (8) Ion Implantation Technique, p. 29–p. 40").

Figure 8A:
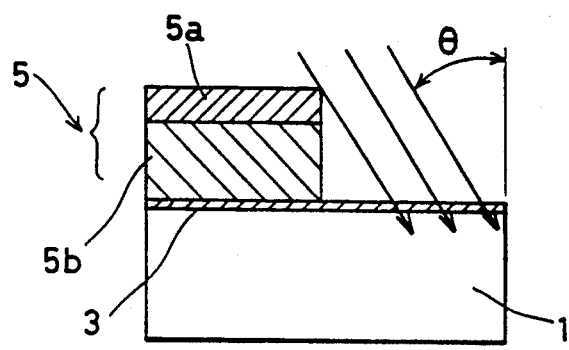
FIGS. 8A–8C are diagrams for describing three factors of the effect of the shielding of the transfer gate electrode 5 in the ion implantation.
Figure 8B:
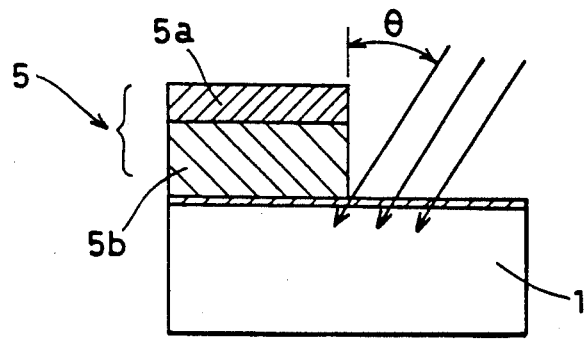
Figure 8C:
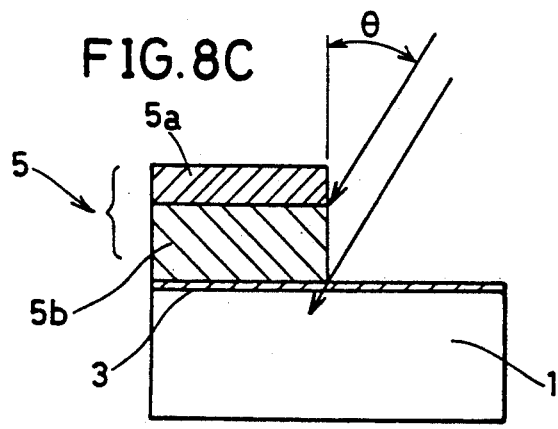

The expression of the three dimensional concentration distribution N (X, Y, Z) of the impurity ion yielded by this LSS theory is illustrated below.

$$N(x, y, x) = \frac{1}{(2\pi)^{3/2} <\Delta R_p> <\Delta X> <\Delta Y>} \times$$

$$\exp\left( -\frac{X^2}{2<\Delta X^2>} - \frac{Y^2}{2<\Delta Y^2>} - \frac{(Z - <R_p>)^2}{2<\Delta R_p^2>} \right)$$

where:

$<\Delta R_p>$: the standard deviation of $R_p$ $<\Delta X^2>$, $<\Delta Y^2>$: mean square of the x-direction and y-direction deviations $<\Delta X> = \sqrt{<\Delta X^2>}$ : the extenstion of $R_p$ in the x-direction $<\Delta Y> = \sqrt{<\Delta Y^2>}$ : the extenstion of $R_p$ in the y-direction Next, in addition to the above LSS theory, the numeral analysis in which a weight function is introduced in consideration with the shadowing effect and the gate penetration effect of the transfer gate electrode 5 will now be described. The oblique rotation implantation includes three factors shown in FIGS. 8A, 8B and 8C. The first one is a factor of the shadowing with respect to the implanted ion at the edge of the transfer gate electrode 5 (refer to FIG. 8A, which is referred to as the factor "A" here. The second factor is a factor due to the direct penetration of the ions from the semiconductor substrate 1 surface to a portion under the transfer gate electrode 5 (refer to FIG. 8B), which is referred to as the factor "B" here. The third factor is one due to the ion penetration through the polysilicon gate 5b at the side of the transfer gate electrode 5 (refer to FIG. 8C), and this is referred to as the factor "C" here.

All of these three factors "A", "B" and "C" function to reduce the number of ions implanted into the semiconductor substrate as compared to the case of absence of the transfer gate electrode 5. Therefore, their effect can be taken as a concept of the probability. In other words, the ratio of the number of ions implanted into the substrate in case where the transfer gate electrode 5 actually exists to the number of ions implanted into the semiconductor substrate 1 in case where the transfer gate electrode 5 does not exist is introduced. This ratio depends on the distance from the transfer gate electrode 5 almost obviously.

Roughly speaking, the impurity distribution produced by the oblique rotation ion implantation is composed of two components. One is related to ions implanted from the semiconductor substrate 1 surface, which includes the factors "A" and "B". The other is related to ions implanted from the side of the polysilicon gate, which includes the factor "C". Taking the factors "A", "B" and "C" as weights, the impurity distribution N (x, z) produced by the oblique rotation implantation can be provided as shown below.

$$N(X, z) = N_o \cos\theta \{W(x)(z) + W_{mod}(x)_{mod}(z)\}$$

where:
- $N_o$: the irradiated amount of the impurity ion per a unit-area
- $\theta$: the tilt angle of the ion implantation direction to the direction vertical to the substrate
- W (x): the weight function in the x-direction by the factors "A", "B"
- $W_{mod}$ (x): the weight function in the x-direction by the factor "C"
- P (x): the concentration distribution in the z-direction in case of W (x)=1.0, $W_{mod}$ (x)=0
- $P_{mod}$ (z) the concentration distribution in the z-direction in case of W (x)=0, $W_{mod}$ (x)=1.0

The first term of the above expression "$N_o \cos\theta$ W (x) P (z)" shows a component implanted from the surface of the semiconductor substrate, and the second term "N cos $\theta$ $W_{mod}$(x) $P_{mod}$(z)" shows a component implanted from the side of the polysilicon gate $5b$.

Figure 9:
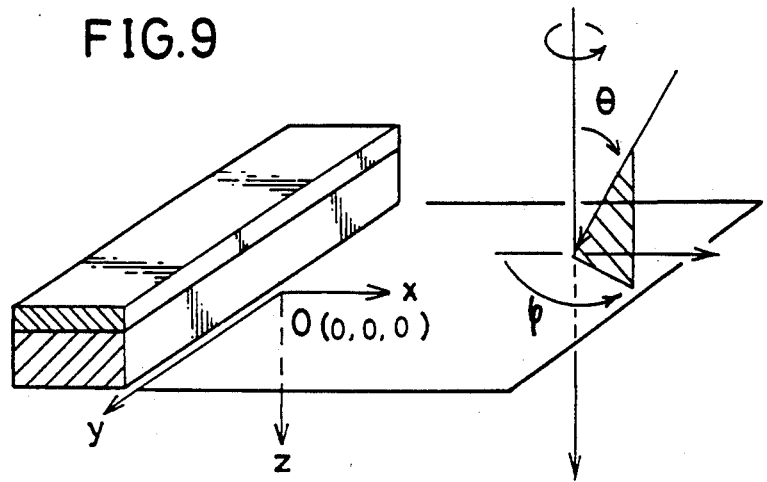
FIG. 9 is a diagram for describing the coordinate systems employed in the analysis of the oblique rotation ion implantation.

In the system of coordinates, the origin O is located on the semiconductor substrate 1 surface under the side of the transfer gate electrodes 5, and the x, y and z axes are located as shown in FIG. 9.

Figure 10A:
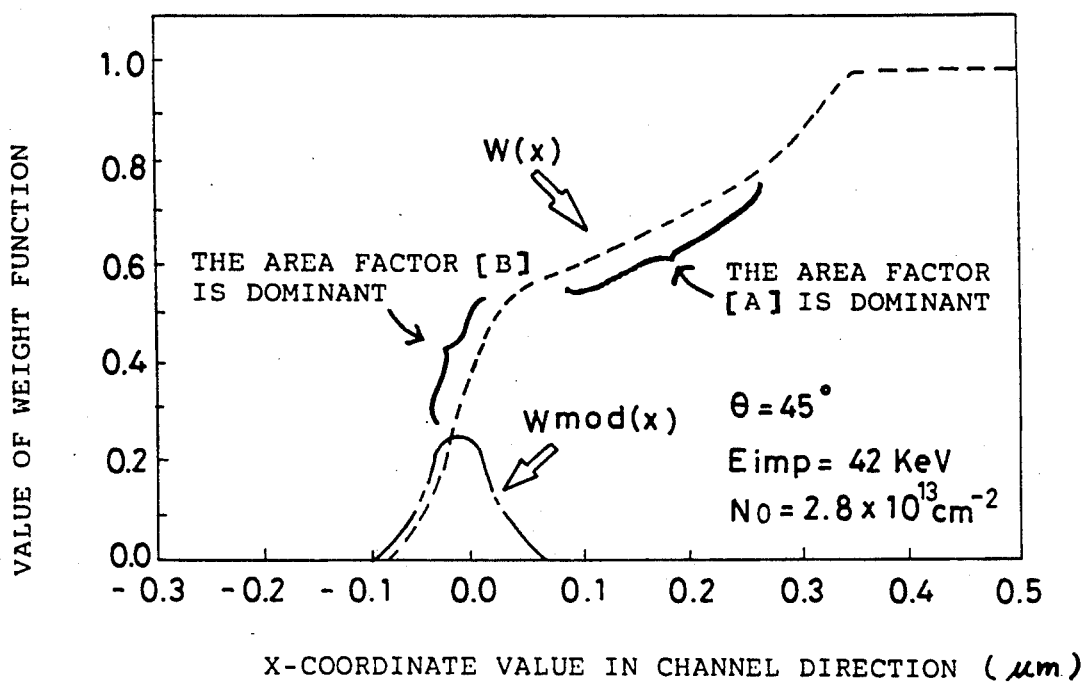
FIG. 10A is a diagram showing the distribution of the weight function W (x), $W_{mod}$ (x) with consideration of the shadowing effect and the penetrating effect of the transfer gate electrode, and the FIG. 10B is a diagram similarly showing the distribution of the distribution function in the direction of depth P (z), $P_{mod}$ (z).
Figure 10B:
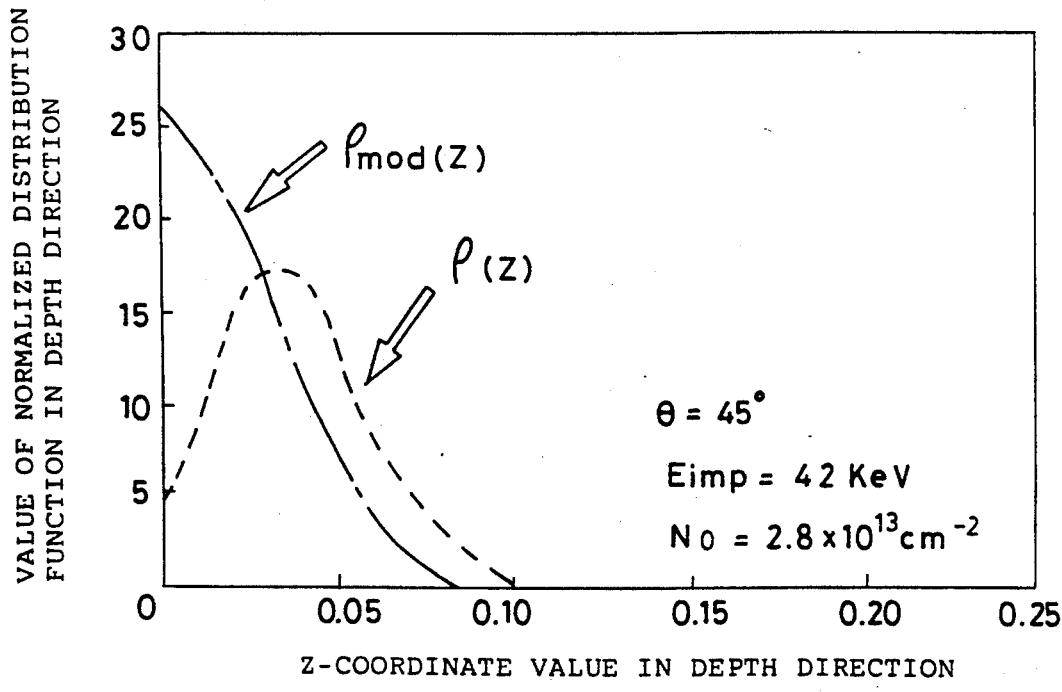

As a specific example of the distribution of the weight function, for $\theta$=45°, at an implanted ion irradiation energy $E_{imp}$=42 keV, and $N_o$=2.8×10$^{13}$ cm$^{-2}$, the results of calculation of W (x), $W_{mod}$(x), P(z) and $P_{mod}$ (z) are shown in FIGS. 10A and 10B.

From the function values yielded as described above and the above expression of N (x, y, z), the calculated results of the impurity ion concentration distribution in the vicinity of the channel surface is shown by the curve of the broken line in the graph of FIG. 5.

Also, the oblique ion implantation method employed to form the p-type regions 19a and 19b in the second conventional example can be applied to formation of the ion-implanted regions 4 in the steps of manufacturing MOS type LDD structure transistors according to the above-described embodiments instead of the oblique rotation implantation to form ion-implanted regions 4 provided with similar effects to those in the above embodiment. The profile of the ion-implanted regions 4 immediately after the ion implantation has completed and the corresponding impurity concentration distribution in the vicinity of the substrate surface in case where the ion-implanted regions in the above first embodiment is formed by the oblique ion implantation (referred to as "oblique fixed ion implantation" hereinafter) in symmetrical two directions of a given tilt angle using the transfer gate electrode 5 as a mask are shown by broken lines in FIG. 6. Furthermore, the impurity concentration distribution after a thermal treatment is applied under conditions necessary for the device thereafter is shown by a double dashed line in FIG. 6.

Figure 6:
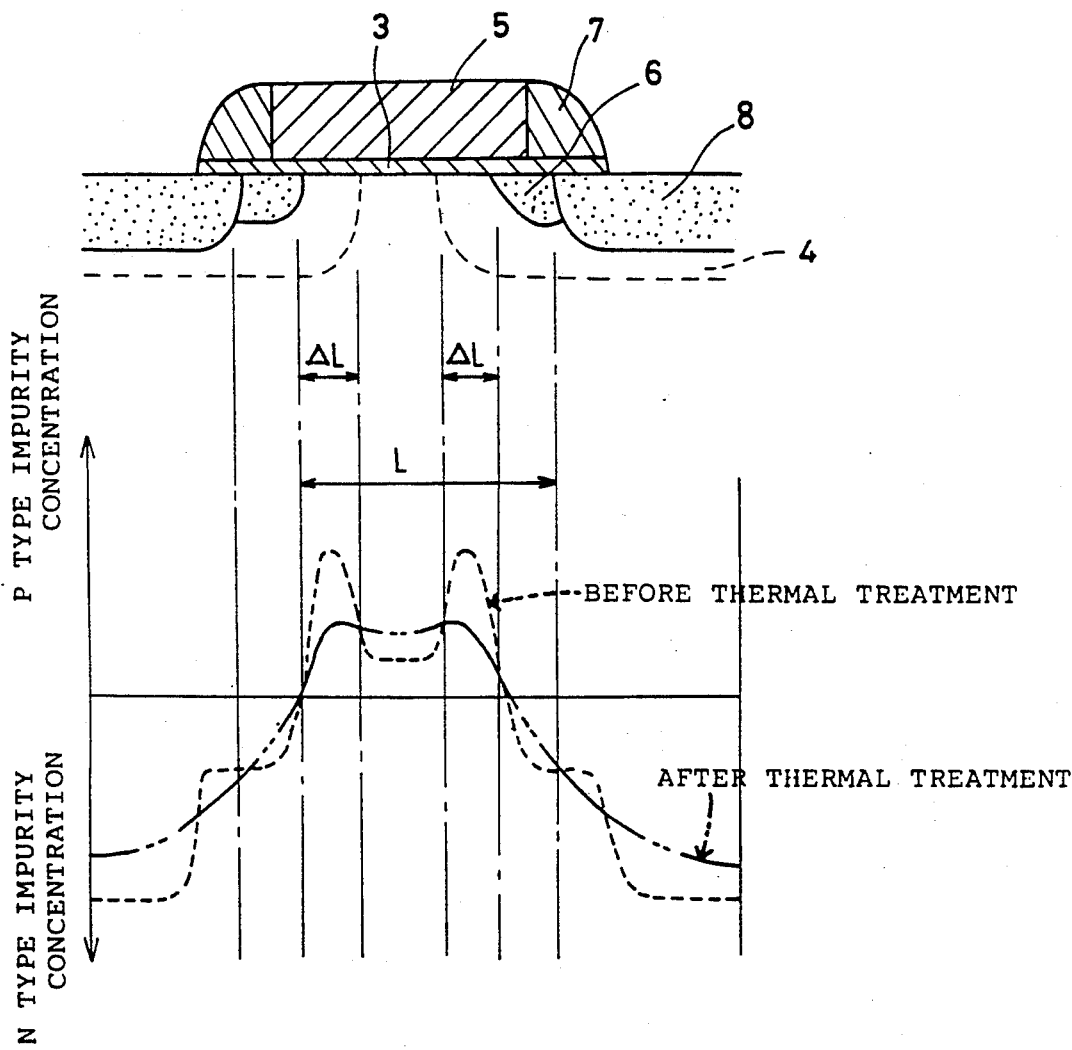
FIG. 6 is a diagram schematically showing the profiles of ion-implanted layers in the vicinity of the channel of the MOS type LDD transistor in case where the ion implanted layers 4 for threshold voltage control are formed according to a similar oblique fixed ion implantation method to the second conventional example in the first embodiment of the present invention instead of the oblique rotation ion implantation, and the corresponding impurity ion concentration distributions.

By making a comparison between graphs shown in FIGS. 5 and 6, it is seen that the impurity ion profile just after the completion of ion implantation formed by the oblique rotation ion implantation has a tendency that the p-type ion concentration is higher in the vicinity of the both ends of the channel, but it varies in a small way as compared to that of the oblique fixed implantation shown in FIG. 6. As already described in the description of conventional art, this is because of the following reasons. First, in the oblique fixed ion implantation, due to shielding by the transfer gate electrode 5 and the sidewall spacers 7, the irradiated ions, of which concentration distribution varies in large degree at the borders of the shadow, are irradiated at the same tilt angle and for a fixed time period, so that the concentration distribution immediately after completion of the ion implantation is considerably affected by the effects of the shadow to vary in the abovementioned large degree. On the other hand, in the oblique rotation implantation, as the irradiated ion stream and the semiconductor substrate 1 rotate with respect to each other, the shadows of the shielding by the transfer gate electrode 5 and the sidewall spacers 7 are constantly changing position. The effect given to the variation of the impurity ion concentration distribution due to the shadow is averaged and relaxed, so that the concentration distribution has small variation.

As described above and as best seen in FIG. 6, the impurity profile formed by the oblique rotation implantation varies little even immediately after the ion implantation, so that it is not greatly affected by the thermal treatment required afterwards. That is to say, as the diffusion of impurity by thermal treatment is proportional to the spatial gradient of impurity profile, the impurity profile formed by the oblique rotation implantation does not vary so greatly in the course of providing the thermal treatment. This means, that the most suitable distribution of the impurity profile after the thermal treatment can be realized under the thermal treatment condition required for maintaining the characteristics of a device like the suitable thermal treatment condition for ensuring the refresh characteristics in the DRAM (Dynamic Random Access Memory), for example. That is to say, as for the impurity ion profile formed by the oblique rotation implantation, as it is not affected so much by the diffusion due to the subsequent thermal treatment under the most suitable condition for manufacturing the device, and the most suitable impurity ion profile can be determined almost independently of the thermal treatment condition.

On the other hand, the impurity profile formed, for example, by the oblique fixed ion implantation per Japanese Patent Laying-Open No. 61-226968 varies greatly immediately after the implantation, so that it is considerably affected by the thermal treatment required thereafter. Therefore, the thermal treatment condition which can maintain the most suitable distribution of the impurity ion profile is not the most suitable thermal treatment condition for the device in many cases. In that method, when the suitable thermal treatment for the device is performed, it is not possible to obtain the most suitable impurity ion profile after the thermal treatment.

As described above, the smaller the variation of the impurity ion profile immediately after completion of the ion implantation is, the more suitable impurity ion profile under the most suitable thermal treatment condition for the device can be obtained. In this sense, it can be said that the oblique rotation implantation is a better ion implantation method for the device design than the oblique fixed implantation.

The threshold voltage almost corresponds to the average value of the channel potential over the channel region. Qualitatively, the summary will be described as follows. When the p-type impurity ion concentration in the length L (shown in FIG. 5) portion in the vicinity of the source/drain region is higher, the threshold voltage in this portion becomes higher, and a decrease in drift velocity proportional to the mobility of carriers, or strength of electric field, due to the impurity scattering in this portion, is caused. Accordingly, the threshold voltage $V_{th}$ over the transistor becomes higher. Thus, by reducing the p-type ion concentration in the center portion of the channel as compared to that of the conventional transistor, the threshold voltage in this portion decreases, and the mobility of this portion increases. Accordingly, the threshold voltage $V_{th}$ over the channel can be reduced. As described above, the threshold voltage $V_{th}$ over the entire channel is determined corresponding to the average value of the p-type impurity ion concentration over the entire channel length (the length L in FIG. 5).

Accordingly, as for the distribution of the channel potential for obtaining a predetermined threshold voltage, by employing the oblique rotation implantation, the channel potential in the vicinity of the source/drain regions increases as compared to the oblique fixed implantation method. As a result, this portion forms a potential barrier to restrain the extension of the depletion layer between the source and drain regions, so that the source/drain breakdown voltage in case of no voltage application to the transfer gate electrode 5 rises. Also, even if the α particles penetrate into the channel region through the source/drain regions, the funnelling phenomena of producing a depletion layer transiently along the penetrating path of the α particles can be restrained by this potential barrier. Accordingly, transient punchthrough between the source and drain due to the ALPEN effect and soft error due to this ("L"→"H" error) are also restrained.

As described above, in accordance with this embodiment, by forming a high potential barrier in the vicinity of the source/drain at both ends of the channel region, even when the device is highly integrated to shorten the effective channel length, good initial characteristics can be obtained. As for transient characteristics as well, it can be operated maintaining good reliability.

Figure 11A:
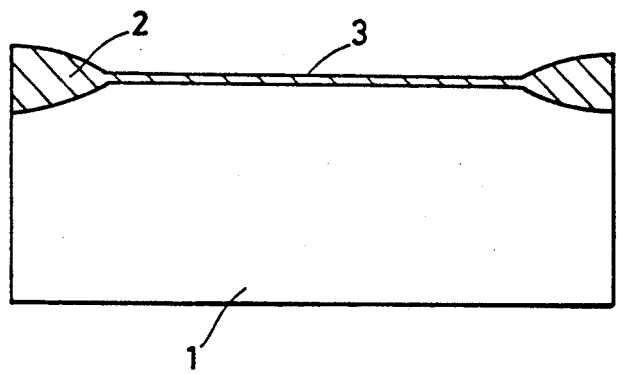
FIGS. 11A–11F are sectional diagrams sequentially and schematically showing the manufacturing process of the second embodiment of this invention.

Next, another embodiment in accordance with this invention will be described based on FIGS. 11A-11B.

Figure 11B:
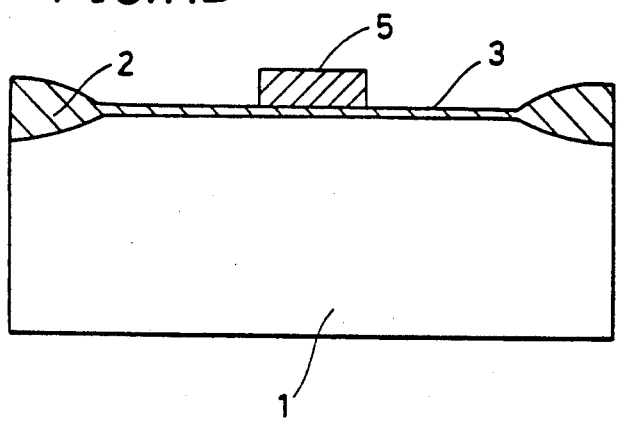

Manufacturing process of this embodiment, as well as the embodiment shown in FIGS. 4A and 4B, comprises the steps of forming a transfer gate insulating film 3 in the element forming region surrounded by the element isolation region 2 on the p-type semiconductor substrate 1 by LOCOS method (FIG. 11A), and forming a transfer gate electrode 5 (FIG. 11B).

Figure 11C:
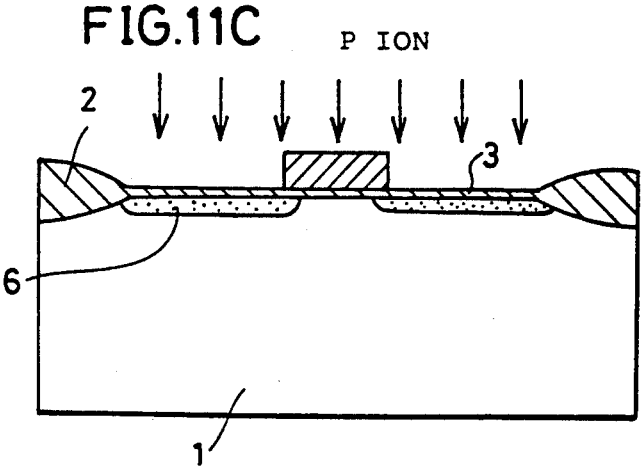
Figure 11D:
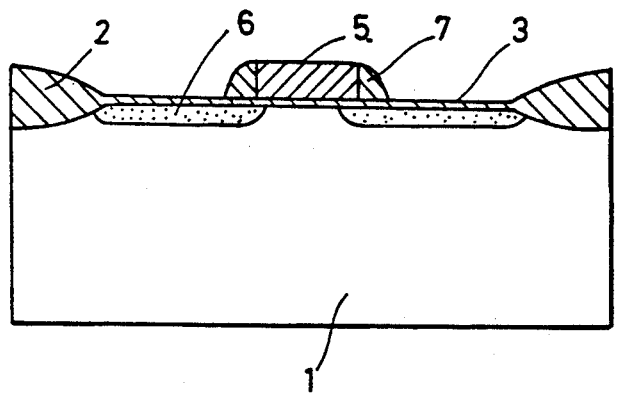

Different from the above embodiment, the p-type ion implantation regions 4 for controlling the threshold voltage is formed by the oblique rotation ion implantation after the n-type ion implantation layers 6 and 8 are formed in this embodiment. That is, in this embodiment, after forming the n-type ion-implanted layers 6 by the oblique ion implantation using the transfer gate electrode 5 as a mask (FIG. 11C), a sidewall spacer 7 is formed (FIG. 11D).

Figure 11E:
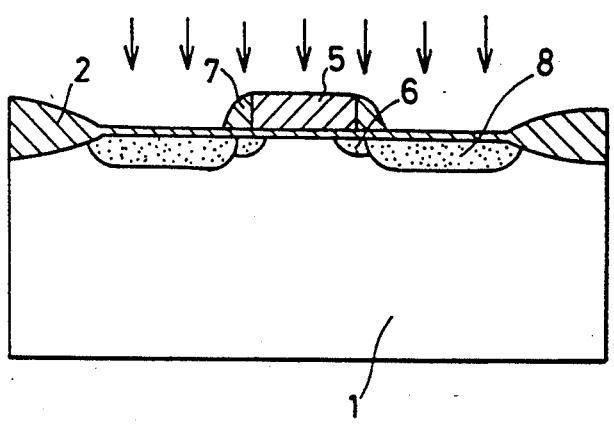
Figure 11F:
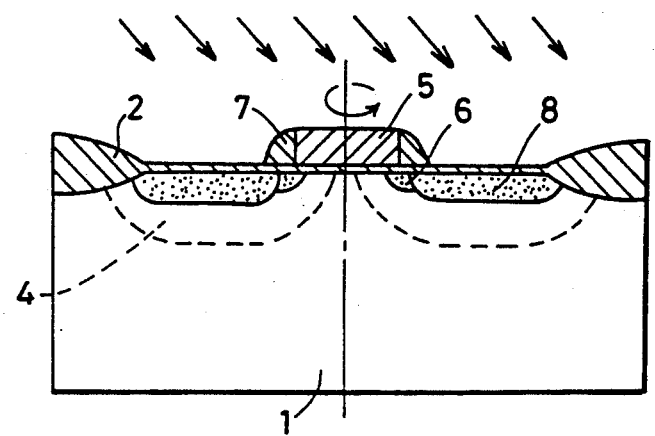

Next, using the transfer gate electrode 5 and the sidewall spacers 7 as masks, n-type ion-implanted layers 8 is formed by the vertical ion implantation (FIG. 11E). After that, rotating the semiconductor substrate 1 around the center normal line of the transfer gate electrode 5, by performing the ion implantation at a predetermined tilt angle θ, using the transfer gate electrode 5 and the sidewall spacers 7 as masks, p-type ion-implanted regions for controlling the threshold voltage is formed (FIG. 11F). Afterwards, a thermal treatment for diffusing the implanted ions is performed.

By the manufacturing steps of this embodiment, almost the same profile of respective ion implanted layers and channel potential distribution as those shown in FIG. 5 can also be obtained.

In the first and the second embodiments described above, this invention is applied to a MOS type LDD structure transistor, but the idea of this invention can also be applied to a MOS type transistor of other than the LDD structure. Embodiments in which this invention is applied to manufacturing a MOS type transistor of other than the LDD structure will be described below.

Figure 12A:
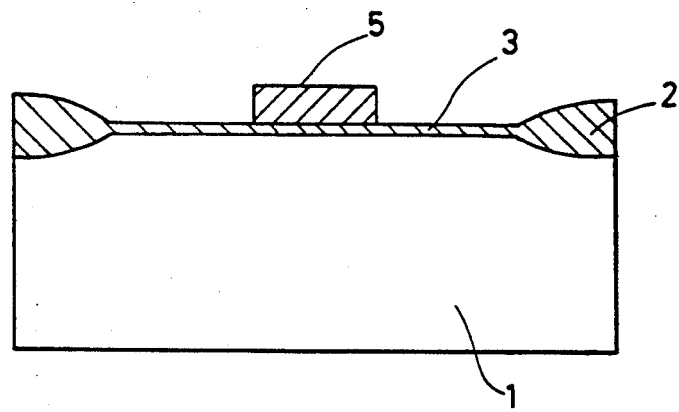
FIGS. 12A–12C are sectional views sequentially and schematically showing the outline of the manufacturing process of the third embodiment in accordance with this invention.
Figure 12B:
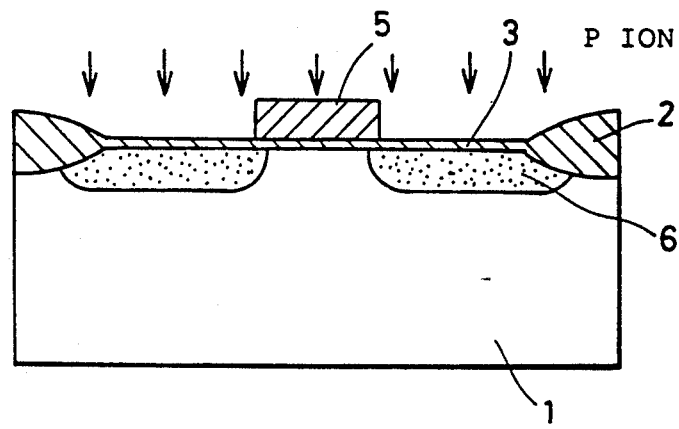
Figure 12C:
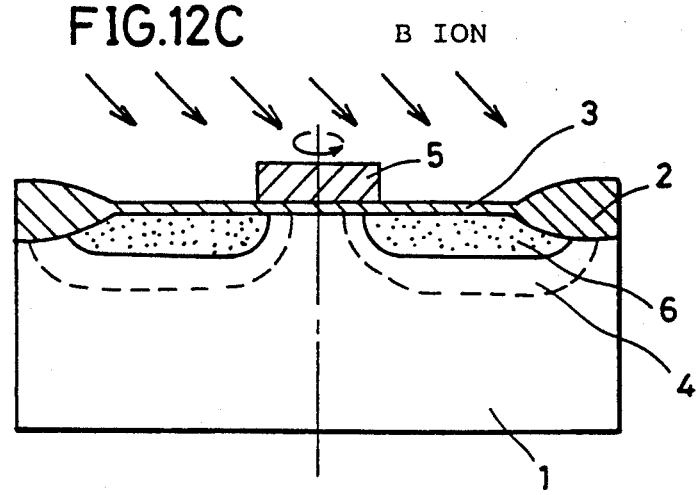

The third embodiment of the process of this invention is shown in FIGS. 12A-12C. This embodiment is of a method of manufacturing a MOS type transistor having no sidewall spacers formed at sidewalls of a transfer gate electrode 5. In the embodiment, a transfer gate electrode 5 is formed by photolithography and reactive ion etching on a transfer gate insulating film 3 on a p-type semiconductor substrate 1 surface (FIG. 12A). Next, using this transfer gate electrode 5 as a mask, n-type impurity, phosphorus or arsenic, is vertically direct onto the substrate surface to form ion-implanted layers 6 to be the source/drain regions (FIG. 12B). Next, while rotating the semiconductor substrate 1 in a horizontal plane, p-type boron ions are irradiated in an oblique direction at a predetermined tilt angle to form ion-implanted regions 4 for controlling the threshold voltage of the channel region (FIG. 12C).

In this way, the present invention can also be applied to the steps of forming MOS type field effect transistors of a single source/drain type.

Figure 13A:
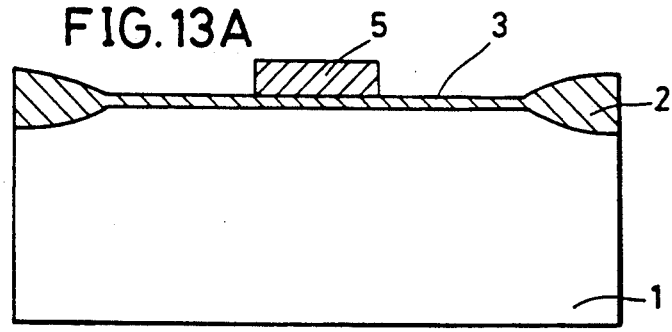
FIGS. 13A–13D are sectional views sequentially and schematically showing the outline of the manufacturing process of the fourth embodiment in accordance with this invention.
Figure 13B:
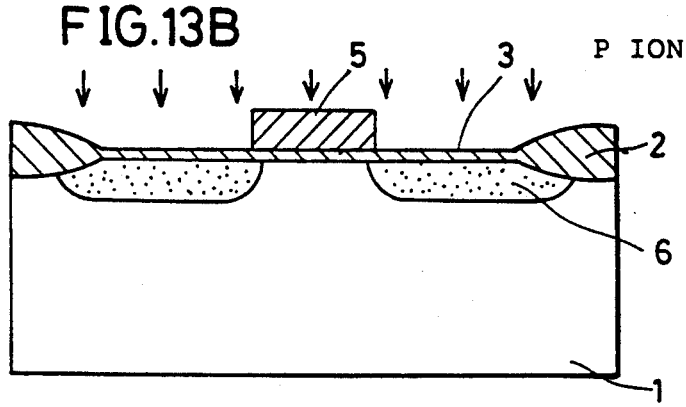
Figure 13C:
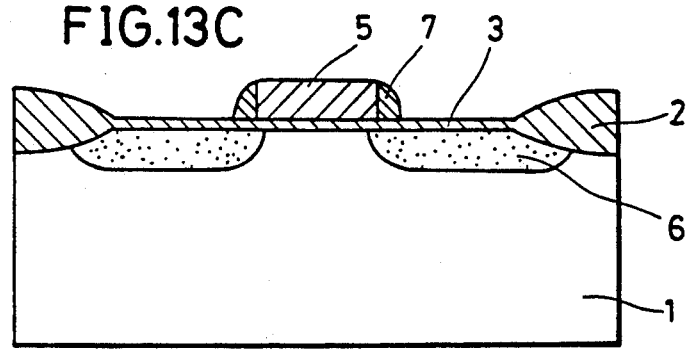
Figure 13D:
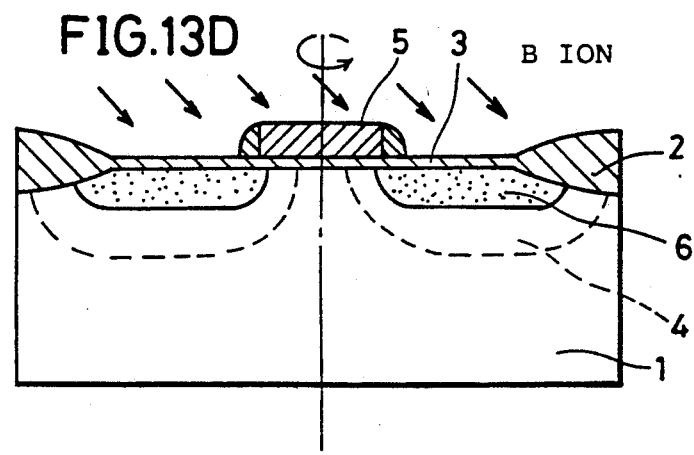

Next, the fourth embodiment in accordance with this invention will be described referring to FIGS. 13A-13D. In this embodiment, as well as the above third embodiment, a transfer gate electrode 5 is formed first (FIG. 13A), and then ion-implanted layers 6 are formed as a source/drain regions by implanting n-type ions using the transfer gate electrode 5 as a mask (FIG. 13B). However, in this embodiment, after forming the ion-implanted layers 6, sidewall spacers 7 are formed at a sidewall of the transfer gate electrode 5 (FIG. 13C), and ion-implanted regions 4 are formed by the oblique rotation ion implantation (FIG. 13D). In this embodiment, as the sidewall spacer 7 is employed for control of forming steps of the ion-implanted regions 4, not for formation of LDD, fine adjustment of the concentration distribution of the ion-implanted regions 4 becomes possible by changing sidewall width independently of LDD.

Figure 14A:
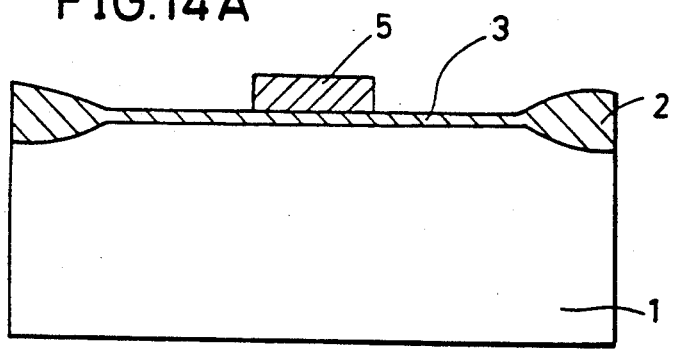
FIGS. 14A–14D are sectional views sequentially and schematically showing the outline of the manufacturing process of the fifth embodiment in accordance with this invention.
Figure 14B:
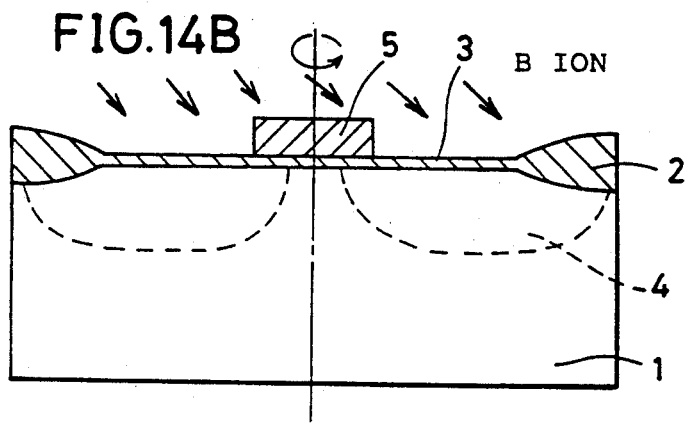
Figure 14C:
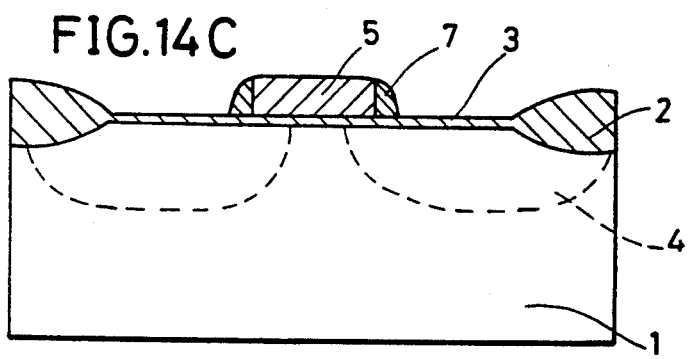
Figure 14D:
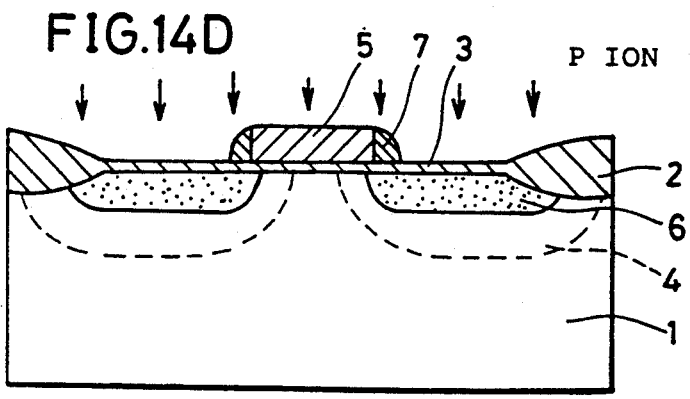

The fifth embodiment of this invention is shown FIGS. 14A-14D. In this embodiment, after forming a transfer gate electrode 5 on a transfer gate electrode insulating film 3 (FIG. 14A), using this as a mask, ion-implanted regions 4 are formed by the oblique rotation ion implantation (FIG. 14B). Next, after depositing a sidewall spacer (FIG. 14C), an ion-implanted layers 6 are formed by the vertical ion implantation. In this embodiment, as the diffusion speed of phosphors is faster than that of boron, the sidewall spacer 7 serves to expand the mask width in case of forming the ion-implanted layer 6.

Figure 15A:
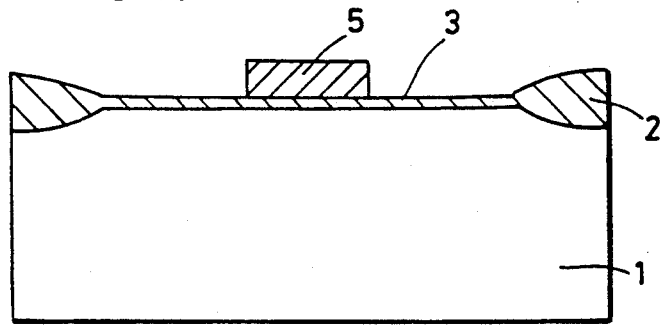
FIGS. 15A–15D are sectional views sequentially and schematically showing the outline of the manufacturing process of the sixth embodiment in accordance with this invention.
Figure 15B:
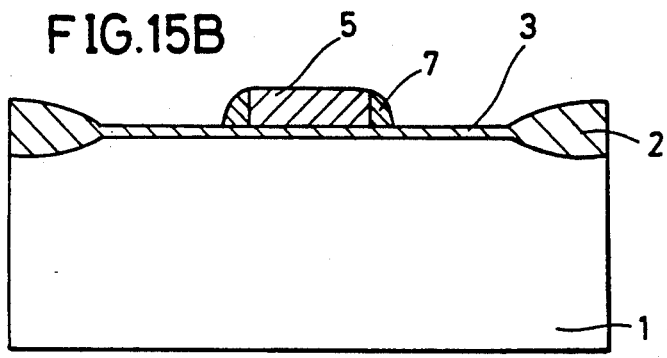
Figure 15C:
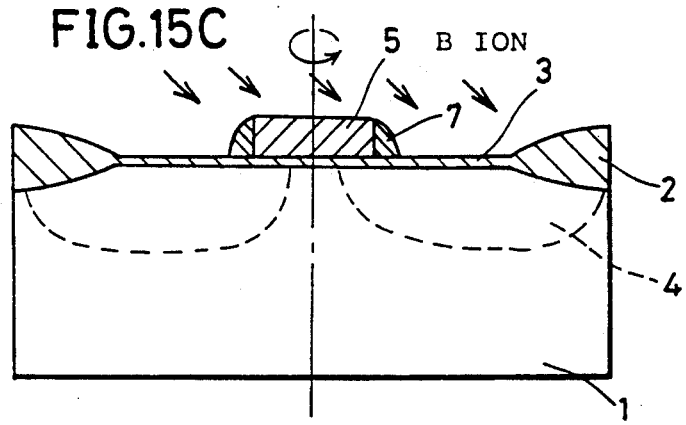
Figure 15D:
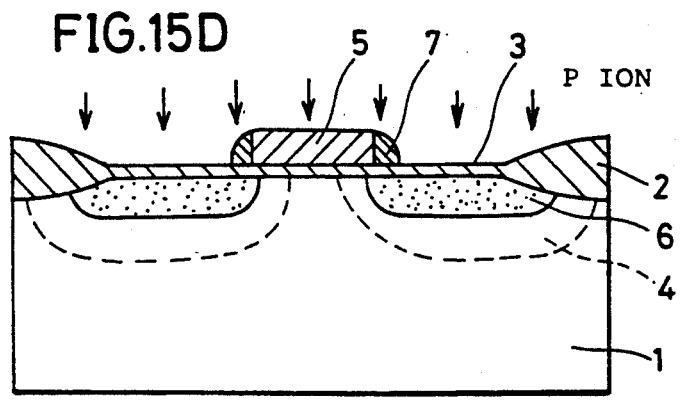

The sixth embodiment of this invention is shown in FIGS. 15A-15D. In this embodiment, immediately after a gate electrode 5 is formed (FIGS. 15A), sidewall spacers 7 are deposited (FIG. 15B), ion-implanted regions 4 are formed by the oblique rotation ion implantation in this condition (FIG. 15C), and then ion-implanted regions 6 are formed by the vertical ion implantation (FIG. 15D).

Figure 16A:
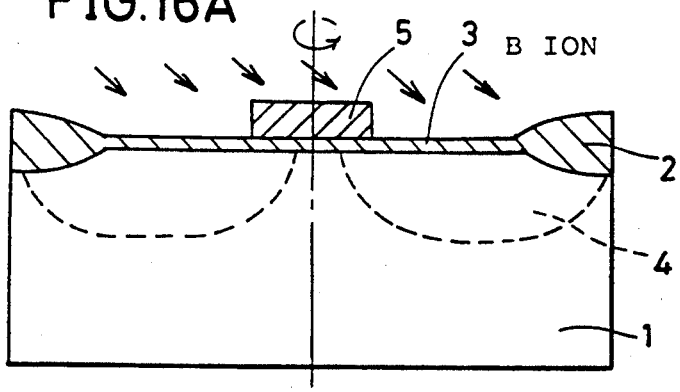
FIGS. 16A–16D are sectional views sequentially and schematically showing the outline of the manufacturing process of the seventh embodiment in accordance with this invention.
Figure 16B:
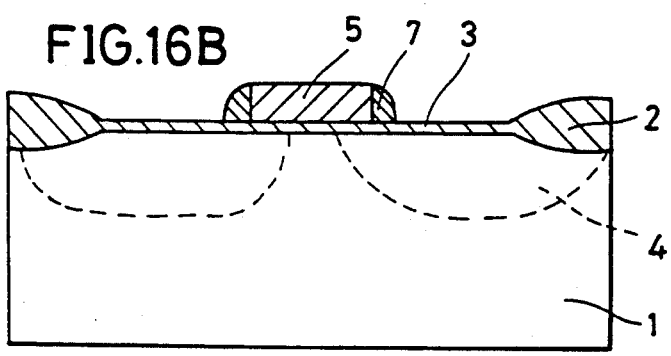
Figure 16C:
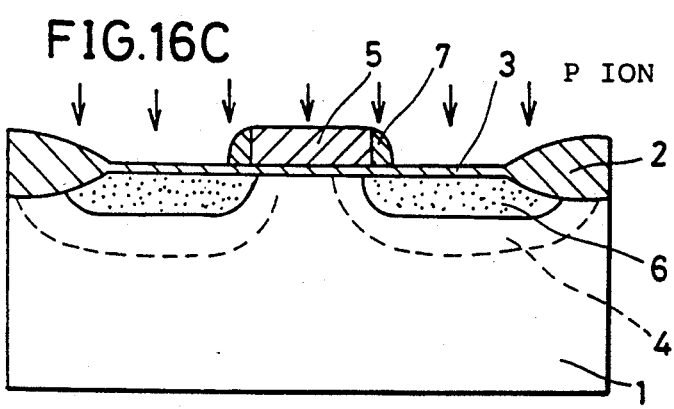
Figure 16D:
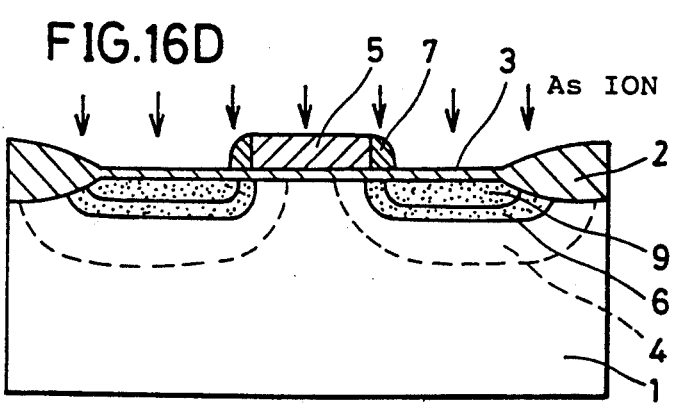

The seventh embodiment of this invention is shown in FIGS. 16A–16D. In this embodiment, after forming an ion-implanted layer 4 by the oblique rotation ion implantation of boron with a transfer gate electrode 5 as a mask (FIG. 16A), sidewall spacers 7 are deposited (FIG. 16B). After that, phosphorus ions are implanted by the vertical ion implantation to form ion-implanted layers 6 of relatively low concentration (FIG. 16C), moreover, arsenic ions having smaller thermal diffusion coefficient than that of phosphorus ions are implanted by vertical ion implantation to form ion-implanted layers 9 of relatively high concentration (FIG. 16D). This is based on an idea that the electric field intensity in the channel portion is reduced by the double ion-implanted layers 6 and 9 having different concentrations formed in this way to avoid punchthrough in the channel, which idea is similar to that of the LDD structure. This structure is referred to as a MOS type double diffused drain (DDD) structure transistor.

Figure 17A:
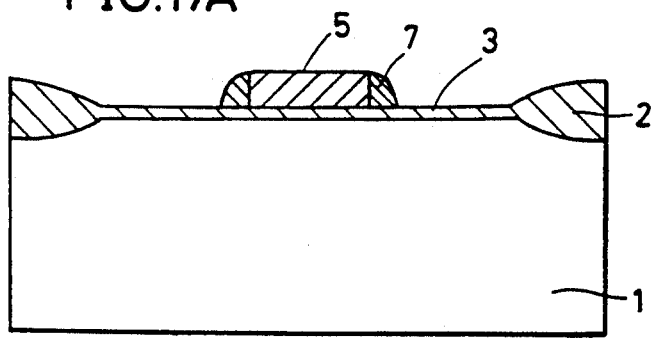
FIGS. 17A–17D are sectional views sequentially and schematically showing the outline of showing the manufacturing process of the eighth embodiment in accordance with this invention.
Figure 17B:
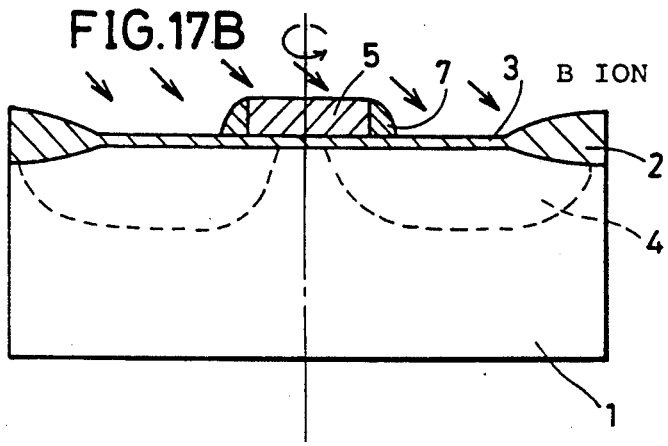
Figure 17C:
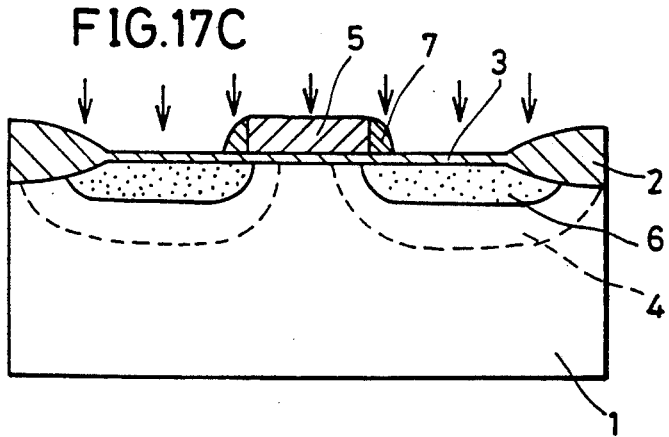
Figure 17D:
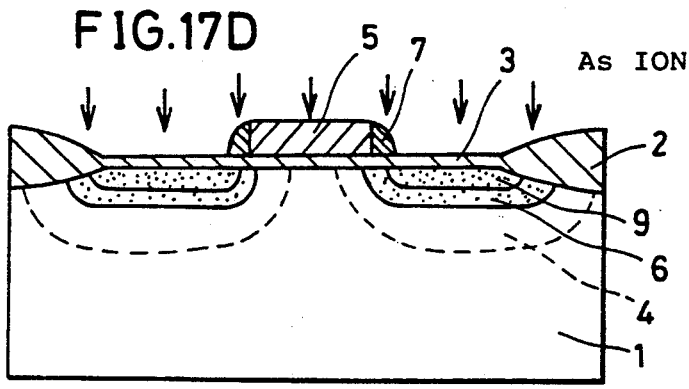

The eighth embodiment of this invention is shown in FIGS. 17A–17D. This embodiment is the same as the above seventh embodiment in that the present invention is applied to forming a MOS type DDD structure transistor. In this embodiment, after depositing sidewall spacers 7 (FIG. 17A), boron ions are implanted by the oblique rotation ion implantation to form p-type ion-implanted regions 4 (FIG. 17B). Phosphorus ions are implanted by the vertical ion implantation thereafter (FIG. 17C), and arsenic ions are further implanted (FIG. 17D) to form a DDD structure, which is the same as the seventh embodiment.

In the above described third through eighth embodiments, the ion-implanted regions 4 for setting a threshold voltage of the channel also have the almost same distribution as that of the first embodiment. Accordingly, after the thermal treatment, impurity concentration distribution as shown by the two-dot chain line of FIG. 5 is obtained, and the electric barrier is formed and the source/drain breakdown voltage can be raised.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a MOS type field effect transistor, comprising:
   a semiconductor substrate having a region of a first conductivity type at least in the vicinity of a surface of the substrate;
   source/drain regions of a second conductivity type, formed at opposite sides of a channel region disposed therebetween, said channel region extending from the surface of said semiconductor substrate to a given depth;
   a transfer gate electrode formed on said semiconductor substrate surface to entirely cover said channel region, with a gate insulating film provided therebetween; and
   a pair of impurity regions of said first conductivity type formed outwardly under outer edge portions of said channel region so as to entirely surround bottom faces of the source/drain regions for controlling a threshold voltage of said channel region,
   wherein said channel region is formed to have a higher impurity concentration distribution of said first conductivity type in relatively outwardly located portions at opposite sides which are adjacent to said source/drain regions than in a part of the channel region located closer to a central portion of said channel region,
   sidewall spacers are formed on side surfaces of said transfer gate electrode,
   said source/drain regions have an LDD structure comprising low concentration ion-implanted layers formed under outer edge portions of said transfer gate electrode and high concentration ion-implanted layers formed outwardly of the respective low-concentration ion-implanted layers.

2. The semiconductor device according to claim 1, wherein:
   said impurity regions comprise impurity ions of the first conductivity type implanted in an oblique direction at a predetermined tilt angle with respect to the surface of said semiconductor substrate with said semiconductor substrate rotating in a plane parallel to the surface thereof.

3. The semiconductor device according to claim 1, wherein:
   said first conductivity type is p-type.

4. The semiconductor device according to claim 3, wherein:
   phosphorus ions are implanted into said transfer gate electrode.

5. The semiconductor device according to claim 3, wherein:
   phosphorus ions or arsenic ions are implanted into said low concentration ion-implanted layers and said high concentration ion-implanted layers.

6. The semiconductor device according to claim 3, wherein:
   boron ions are implanted into said region of the first conductivity type.

7. The semiconductor device according to claim 1, wherein:
   said impurity regions comprise ions implanted from two directions each of which forms a given tilt angle symmetrically with respect to a plane vertical to the surface of the semiconductor substrate.

8. A semiconductor device formed by a manufacturing process comprising the steps of:
   forming a transfer gate electrode on a semiconductor substrate, said substrate having a region of a first conductivity type at least in the vicinity of the surface thereof;
   forming a transfer gate insulating film between the transfer gate electrode and the region of first conductivity type;
   forming low concentration ion-implanted layers on opposite sides of the gate electrode by implanting impurity ions of a second conductivity type while using this transfer gate electrode as a mask;
   forming sidewall spacers composed of insulators at the opposite sides of said transfer gate electrode;
   forming a pair of high concentration ion-implanted layers in said substrate on the opposite sides of the gate electrode by implanting impurity ions of said second conductivity type while using said sidewall spacers and said transfer gate electrode as masks;

implanting impurity ions of the first conductivity type into the surface in an oblique direction at a predetermined tilt angle with respect to a normal to said semiconductor substrate while the substrate is rotating around a rotation axis parallel to said normal after forming said transfer gate electrode and either before forming said low concentration ion-implanted layers or immediately after forming said high concentration ion-implanted layers, in such a manner that said impurity ions of the first conductivity type entirely surround both the high and low concentration ion-implanted layers of the second conductivity type; and performing a thermal treatment to activate said respective high and low concentration ion-implanted layers.

9. The semiconductor device prepared according to claim 8, wherein:

said first conductivity type is p-type, and said second conductivity type is n-type.

10. The semiconductor device prepared according to claim 9, wherein:

the substrate is formed of a p-type semiconductor material, a silicon oxide film is first formed thereon, and the transfer gate electrode is composed of polysilicon and is formed on the silicon oxide film.

11. The semiconductor prepared according to claim 9, wherein:

phosphorus ions or arsenic ions are implanted as impurity ions of the second conductivity type for forming said respective ion implanted layers, and boron ions are employed as impurity ions of the first conductivity type to be implanted while the substrate is rotating at a predetermined tilt angle to the direction of said boron ion implantation.

12. The semiconductor device prepared according to claim 9, wherein:

n-type impurity ions are further implanted into the transfer gate electrode.

13. The semiconductor device prepared according to claim 8, wherein:

the tilt angle for implanting impurity ions of the first conductivity type with said semiconductor substrate rotating is in the range 15°–60° with respect to a normal to the substrate surface.

* * * * *